(12) United States Patent
Kleczewski

(10) Patent No.: US 9,989,414 B2
(45) Date of Patent: Jun. 5, 2018

(54) NOISE REDUCTION FOR PULSED LASERS USING CLUSTERING

(71) Applicant: Agilent Technologies, Inc., Loveland, CO (US)

(72) Inventor: Adam Kleczewski, San Francisco, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 1469 days.

(21) Appl. No.: 13/853,896

(22) Filed: Mar. 29, 2013

(65) Prior Publication Data

US 2016/0299007 A1    Oct. 13, 2016

(51) Int. Cl.
*G01B 9/02* (2006.01)
*G01J 3/453* (2006.01)
*H01S 5/14* (2006.01)
*G01J 3/02* (2006.01)

(52) U.S. Cl.
CPC ............... *G01J 3/453* (2013.01); *G01J 3/027* (2013.01); *H01S 5/14* (2013.01); *G01J 2003/4538* (2013.01)

(58) Field of Classification Search
CPC . G01J 3/453; G01J 2003/4538; H01S 5/0687; H01S 5/06817; G01N 29/46
USPC ....................................................... 356/484
See application file for complete search history.

(56) References Cited

U.S. PATENT DOCUMENTS 5,563,982 A * 10/1996 Wang ....................... G01J 3/453
356/451
5,684,850 A * 11/1997 Warburton .............. G01T 1/171
378/53
5,724,125 A * 3/1998 Ames ........................ G01P 5/26
342/107
6,897,954 B2   5/2005 Bishop et al.
7,187,452 B2   3/2007 Jupp et al.
7,315,365 B2   1/2008 Chen et al.
7,718,948 B2   5/2010 Kiesel et al.
7,840,144 B2  11/2010 Shpantzer et al.
8,063,373 B2  11/2011 Miller
8,084,742 B1  12/2011 Nagarkar (Continued)

FOREIGN PATENT DOCUMENTS

WO    WO2012063066    5/2012

OTHER PUBLICATIONS

Mean Shift, Mode Seeking, and Clustering, Cheng, IEEE Transaction on pattern analysis and machine intelligence, vol. 17, No. 8, Aug. 1995.*

(Continued)

*Primary Examiner* — Tarifur Chowdhury
*Assistant Examiner* — Jonathon Cook

(57) ABSTRACT

An optical measurement method in which a series of light pulses are generated using a pulsed laser having a set of different mode hop sequences (e.g., an external-cavity quantum cascade laser (EC-QCL)), the light pulses are detected with the detector to generate a respective pulse data set for each of the light pulses, and the pulse data sets are sorted into classes based on correlation coefficients. Sorting the pulse data sets into classes allows the pulse data sets originating from each of the mode hop sequences of the pulsed laser to be treated independently of the pulse data sets originating from others of the mode hop sequences in subsequent processing.

20 Claims, 11 Drawing Sheets

(56) References Cited

U.S. PATENT DOCUMENTS

| | | | |
|---|---|---|---|
| 8,294,809 B2 | 10/2012 | Stettner | |
| 2002/0019052 A1* | 2/2002 | Nolan | C12N 15/87 |
| | | | 435/461 |
| 2004/0071173 A1* | 4/2004 | Huang | H01S 5/0014 |
| | | | 372/29.02 |
| 2006/0181964 A1 | 8/2006 | Coene et al. | |
| 2007/0043280 A1 | 2/2007 | Mannheimer et al. | |
| 2012/0033220 A1* | 2/2012 | Kotidis | B82Y 20/00 |
| | | | 356/445 |

OTHER PUBLICATIONS

K-means and Hierarchical Clustering, Andrew Moore, School of computer Science Carnegie Mellon University, Nov. 2001.*

A Clustering Method for Efficient Segmentation of 3D Laser Data, Klasing et al, 2008 IEEE international conference on Robotics and Automation, Pasadena, CA, May 2008.*

Yousefi, "Digital pulse shape discrimination methods for triple-layer phoswich detectors using wavelets and fuzzy logic", Bibliographic Information Thesis (Electrical Engineering and Computer Science), Jul. 10, 2008, Oregon State University.

* cited by examiner

NOISE REDUCTION FOR PULSED LASERS USING CLUSTERING

BACKGROUND

External-cavity quantum cascade lasers (EC-QCLs) have received considerable attention in the academic literature because a single EC-QCL can be tuned over a significant portion of the 'fingerprint region' of the electromagnetic spectrum. This makes EC-QCLs potentially useful in a wide range of chemical detection applications. An EC-QCL typically includes an external optical cavity in which are located an optical tuning device, such as a grating, and a QCL chip that generates light. The QCL chip includes a periodic series of thin semiconductor layers of varying material composition that form a superlattice in which a single electron can cause the emission of multiple photons.

EC-QCLs typically have to be operated in a pulsed mode (sometimes referred to as a "quasi-continuous wave mode" or a "quasi-CW mode") to achieve broad tunability. In pulsed mode, the QCL chip is switched on for brief time period (typically 50-500 ns, and referred to herein as an ON period), and then switched off for a much longer time period (typically 0.1-1 µs, and referred to herein, and referred to herein as an OFF period) to allow the QCL chip to cool down before the next ON period. Operated this way, the QCL chip never achieves thermal equilibrium. Additionally, the temperature of the QCL chip increases between the beginning and the end of each ON period. The increasing temperature causes the frequency of the light generated by the QCL chip to change monotonically between the beginning and the end of each ON period. This change in frequency is known as chirp. In an EC-QCL, the changing frequency of the light generated by the QCL chip causes the EC-QCL to hop among the longitudinal modes of the external cavity. When a mode hop occurs the frequency, phase, and intensity of the light emitted by the EC-QCL all change discontinuously. There may be as many as six or more mode hops over the duration of a single 200 ns pulse. Mode hops increase the intensity noise in an EC-QCL, and make the frequency and phase of the emitted light unstable.

In some applications it is desirable to average pulse data sets representing multiple pulses of light generated by a light source to reduce the effect of noise. However, in applications in which an EC-QCL operated in quasi-CW mode or another type of pulsed laser that exhibits mode hopping is used as the light source, averaging and some other post-processing techniques are problematic.

Accordingly, what is needed is a way to use averaging and other post-processing techniques in applications in which a pulsed laser that exhibits mode hopping, such as an EC-QCL, is used as the light source for performing optical measurements.

DETAILED DESCRIPTION

For a given position of the tuning grating in an external cavity quantum cascade laser (EC-QCL), at the beginning of each ON period, the EC-QCL begins to operate in one of a small number (typically, a single digit) of longitudinal cavity modes that, for brevity, will be referred to as initial modes. Each initial mode is followed by a reasonably well determined sequence of mode hops that, for brevity, will be referred to herein as a mode hop sequence. As a result, in a given position of the tuning grating, the EC-QCL generates the light pulses using a relatively small number of mode hop sequences that can be regarded as constituting a set of mode hop sequences. The relatively small number of mode hop sequences used by the EC-QCL enables each light pulse generated by the EC-QCL to be identified as belonging to one of a relatively small number of classes, each of which corresponds to a respective mode hop sequence, and allows respective pulse data sets that represent the light pulses to be sorted into classes before they are further processed. Sorting the pulse data sets according to class enables mitigation of some of the effects of the mode hops during the subsequent processing.

Figure 1:
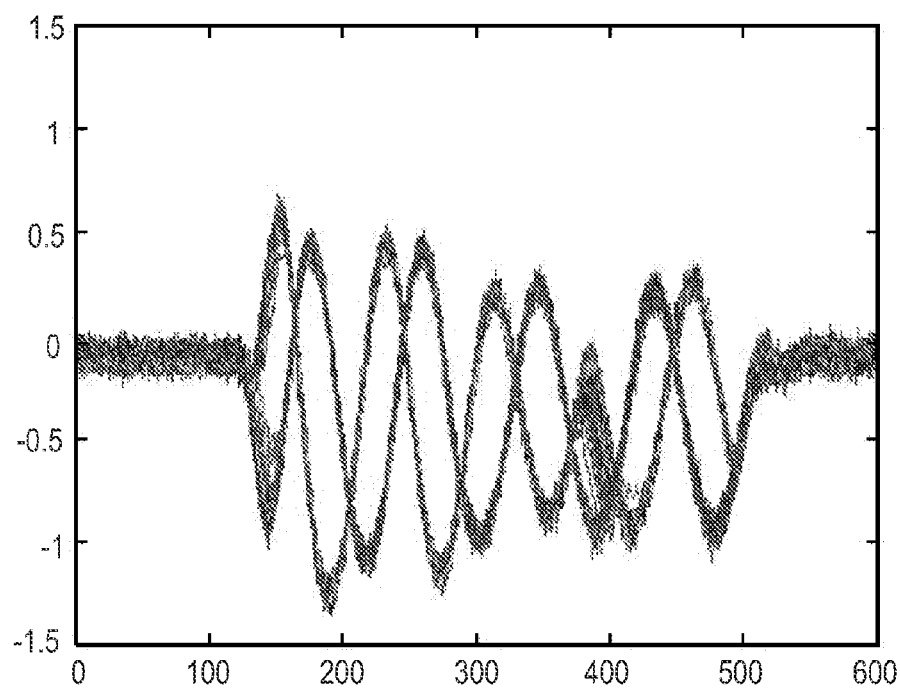
FIG. 1 is a graph showing the variation of amplitude with time of 100 output pulses from a quantum cascade laser that have been superimposed.

FIG. 1 is a graph showing the variation of amplitude with time of 100 output pulses generated by an EC-QCL that have been superimposed. The graph clearly shows pulses arising from three different mode hop sequences.

If the 100 output pulses shown in FIG. 1 were averaged to produce a single average waveform, some of the structure contained the output pulses arising from each of the mode hops sequences would be lost in the average waveform. In some types of optical spectrometer, such as a heterodyne optical spectrometer, but, in most cases, not a simple absorption optical spectrometer, the power contained in the intra-pulse structure in the signal is of interest, and information would be lost if all the pulses were averaged regardless of the mode hop sequences from which the pulses originated. Averaging all the pulses together would tend to reduce the power in the intra-pulse fluctuations since the pulses originating from one mode hop sequence are not necessarily in phase with the pulses originating from other mode hop sequences. Therefore simply combining all the pulses to produce a single average would distort the final averaged waveform in an unpredictable way.

Figure 2:
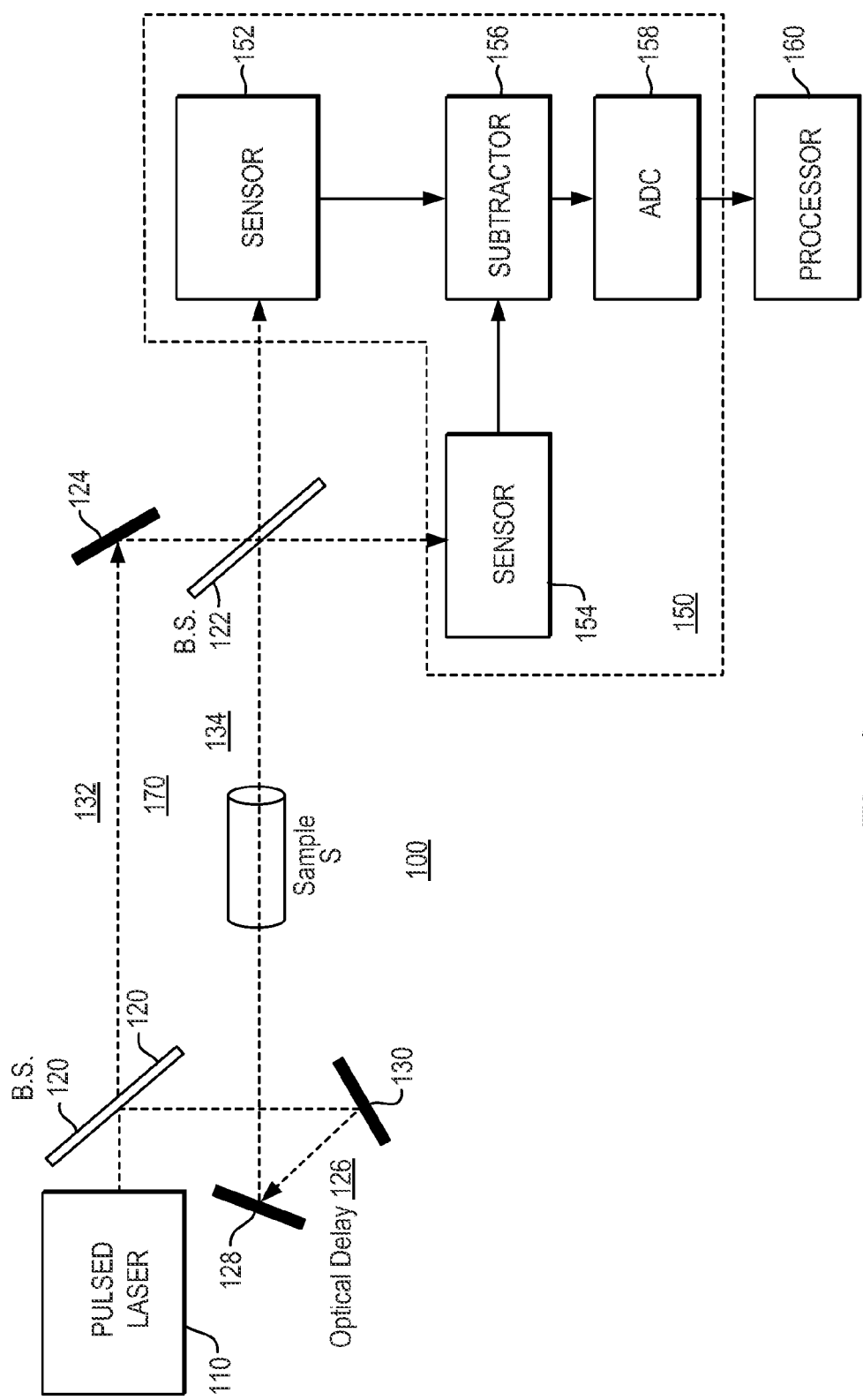
FIG. 2 is a block diagram showing an example of a heterodyne optical spectrometer having an EC-QCL as its light source in accordance with an embodiment.

FIG. 2 is a block diagram showing an example of an optical heterodyne spectrometer 100 having an external cavity quantum cascade laser (EC-QCL) as its light source in accordance with an embodiment. The example of heterodyne spectrometer 100 shown is used to measure an optical property, such as an absorption spectrum, of a sample. Heterodyne spectrometer 100 is composed of an EC-QCL 110, a detector 150, a processor 160, and an optical path 170 between the pulsed laser and the detector. Optical path 170 has a first branch 132 and a second branch 134 of different optical path lengths. Heterodyne spectrometer 100 additionally includes a first beam splitter 120, a second beam splitter 122, a reflector 124, and an optical delay 126 composed of reflectors 128, 130. Detector 150 includes two sensors 152, 154. EC-QCL 110, beam splitters 120, 122, reflectors 124, 128 and 130, branches 132, 134, and sensors 152, 154 are arranged as follows. Light pulses generated by EC-QCL 110 are incident on first beam splitter 120. Beam splitter 120 divides the light pulses generated by laser 110 between the branches 132, 134 of optical path 170. Reflector 124 is arranged to direct the light pulses in optical path 132 onto second beam splitter 122. Reflectors 128, 130 provide the increased optical path length of branch 134 relative to branch 132. Additionally, reflectors 128, 130 are arranged to direct the light pulses in branch 134 to mix with the light pulses from branch 132 at second beam splitter 122. Part of the intensity of the mixed light pulses from branches 132, 134 passes through beam splitter 122 and is incident on sensor 152. The remainder of the intensity of the mixed light pulses from branches 132, 134 is reflected by beam splitter 122 onto sensor 154. A sample S, whose optical properties are to be measured, is shown located in branch 134. Alternatively, sample S may be located in branch 132.

As noted above, EC-QCL 110 is operated in quasi-CW mode, so that each light pulse generated by laser 110 is chirped, i.e., the frequency of the light changes monotonically with time during the pulse. As a result of optical delay 126 in the branch 134 of optical path 170, the light pulses arriving at beam splitter 122 via branch 134 are delayed relative to the light pulses arriving via branch 132. Consequently, at that any instant of time, the light incident on beam splitter 122 from branch 132 differs in frequency from that incident from branch 134. The variations in the intensity of the mixed light pulses due to interference between the light pulses received from branches 132, 134 of optical path 170 are detected by sensors 152, 154.

Detector 150 additionally includes a subtractor 156 and an analog-to-digital converter 158. In response to the light pulses incident thereon, each sensor 152, 154 generates respective analog electrical pulses that are input to subtractor 156. Subtractor 156 generates difference pulses that are digitized by analog-to-digital converter (ADC) 158. The ADC outputs to processor 160 a pulse data set corresponding to each difference pulse and, hence, to each light pulse generated by laser 110.

Another embodiment of detector 150 (not shown) includes two ADCs and a digital subtractor. One of the ADCs is connected to receive analog electrical pulses from sensor 152 and the other of the ADCs is connected to receive analog electrical pulses from sensor 154. The digital outputs of the ADCs are connected to respective inputs of the subtractor. The subtractor subtracts the digital output of one of the ADCs from that of the other to generate a pulse data set corresponding to each light pulse generated by laser 110.

Although not shown, heterodyne spectrometer 100 typically additionally normalizes the signals subject to subtraction. In the example shown, normalization can be accomplished optically by, for example, configuring beam splitter 122 to transmit half of the intensity of the light incident thereon, and to reflect the remaining half of the intensity of the light incident thereon. Alternatively, the analog electrical pulses output by sensors 152, 154 respectively can be selectively amplified and/or attenuated prior to subtractor 156 to normalize the signals subject to subtraction. In an embodiment in which the analog electrical pulses generated by sensors 152, 154 are digitized prior to subtraction, one or both of the pulse data sets resulting from the digitization can the multiplied or divided prior to subtraction to normalize the signals subject to subtraction.

Processor 160 sorts the pulse data sets into classes based on correlation.

In the example shown, and in other examples in which a pulsed laser that exhibits mode hopping when operated in a quasi-CW mode is used as a light source, the light pulses generated by the laser are detected by detector 150 or a similar detector to generate a respective pulse data set for each of the light pulses, and processor 160 or a similar processor is used to sort the pulse data sets into classes based on correlation. Each class corresponds to a respective mode hop sequence of the pulsed laser. In an example in which the pulsed laser has five mode hop sequences, processor 160 will sort most, if not all, of the pulse data sets into five classes.

After the pulse data sets have been sorted into classes based on correlation, the pulse data sets within each class are well correlated in the sense that correlations among the pulse data sets in each class are greater than correlations between the pulse data sets in one class and the pulse data sets in another class. In an example in which the pulse data set of sorted into two classes named class 1 and class 2, correlations among the pulse data sets in class 1 are greater than correlations between the pulse data sets in class 1 and the pulse data sets in class 2.

Pulse data sets sorted into classes based on correlation can be further processed. For example, the pulse data sets in each class can be separately averaged to generate a respective average pulse data set for the class, with each average pulse data set corresponding to a respective mode hop sequence of the pulsed laser. Such averaging is capable of reducing noise because the average pulse data set is an average of like pulse data sets that is not perturbed by the inclusion of pulse data sets originating from different mode hop sequences.

Figure 3:
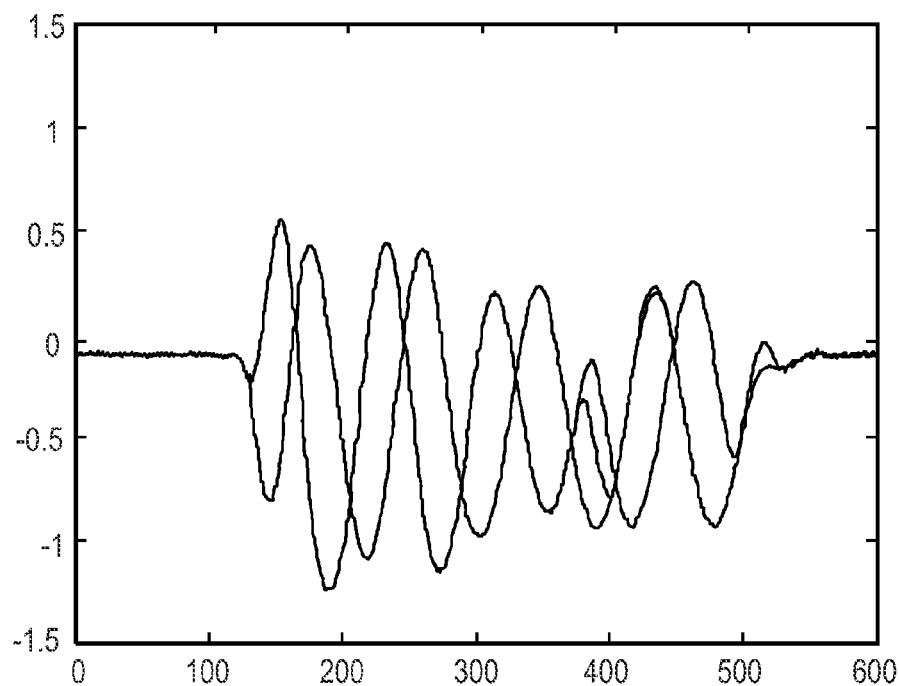
FIG. 3 is a graph showing two pulses generated by the heterodyne spectrometer shown in FIG. 2 by sorting the pulse data sets into three classes and averaging the pulse data sets in each of the classes.

FIG. 3 is a graph showing three superposed pulses. The pulses are a first pulse obtained by averaging the pulse data sets in a first class, a second pulse obtained by averaging the pulse data sets in a second class and a third pulse obtained by averaging the pulse data sets in a third class. It can be seen that the amplitude of the noise on the three averaged pulses shown in FIG. 3 is clearly reduced compared with the noise amplitude of the 100 unprocessed pulses shown in FIG. 1, but the qualitative features of the three pulses are retained.

Figure 4:
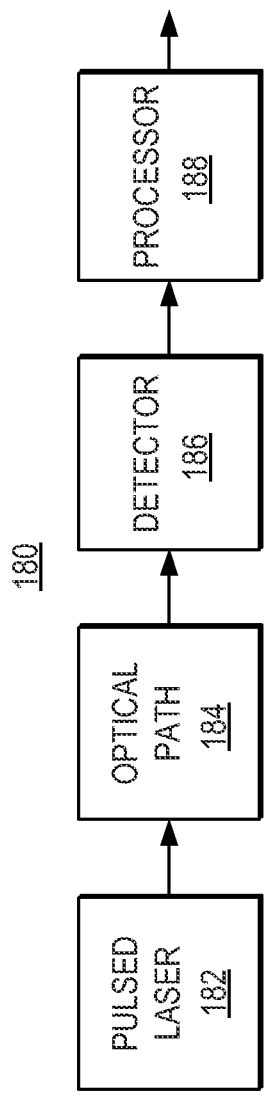
FIG. 4 is a block diagram showing an example of an optical instrument in accordance with an embodiment.

FIG. 4 is a block diagram showing an example 180 of an optical instrument in accordance with an embodiment. Optical instrument 180 includes an external cavity quantum cascade laser (EC-QCL) 182 that generates a series of light pulses using a set of different mode hop sequences. A detector 186 is optically coupled to EC-QCL 182 by an optical path 184 that includes a sample or some other element with optical properties that make measurable changes to the properties of the light pulses generated by EC-QCL 182. Detector 186 generates a respective pulse data set in response to each of the light pulses generated by the EC-QCL. Detector 186 has an electrical output coupled to a processor 188. Processor 188 operates to sort the pulse data sets generated by the detector into multiple classes based on correlation in a manner similar to that described above with reference to FIG. 2. Another type of pulsed laser that exhibits mode-hopping may be substituted for EC-QCL 182.

Figure 5:
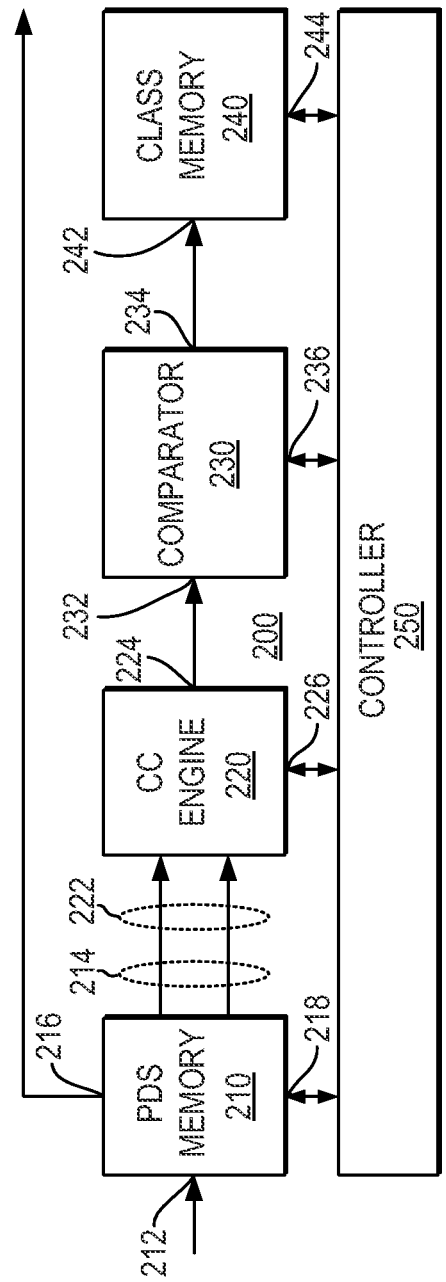
FIG. 5 is a block diagram showing a first example of a processor that may be used as the processor of the heterodyne spectrometer shown in FIG. 2, or the optical instrument shown in FIG. 4.

FIG. 5 is a block diagram showing a first example 200 of a processor that may be used as processor 160 in heterodyne spectrometer 100 described above with reference to FIG. 2 and as processor 188 in optical instrument 180 described above with reference to FIG. 4. In the example shown, processor 200 calculates correlation coefficients that are used to identify the pulse data sets that are well correlated so that such pulse data sets can be assigned to the same class. The example of processor 200 shown includes a pulse data set (PDS) memory 210, a correlation coefficient engine 220, a comparator 230, a class memory 240 and a controller 250. In a typical embodiment, pulse data set memory 210 and class memory 240 are respective portions of a common physical memory.

Pulse data set memory 210 has an input 212 to receive pulse data sets from detector 150 (FIG. 2) during operation of heterodyne spectrometer 100. Pulse data set memory 210 has an output 214 to deliver pulse data sets to correlation coefficient engine 220. Output 214 is shown in FIG. 3 as having two paths to simply to indicate that the correlation coefficients generated by correlation coefficient engine 220 are correlation coefficients between pairs of pulse data sets received from the pulse data set memory. More typically, the pulse data sets for which the correlation coefficients are generated are output serially via a single path. Pulse data set memory 210 additionally has a pulse data set output 216 via which all the pulse data sets sorted into a given class are output at the end of a sorting operation. Finally, pulse data set memory 210 has an input/output port 218 connected to controller 250 via which control signals are exchanged between the pulse data set memory and the controller.

In an example, pulse data set memory 210 is organized into memory blocks each capable of storing a single pulse data set and addressed by a respective block address.

Correlation coefficient engine 220 has an input 222 via which it receives pulse data sets from pulse data set memory 210. Input 222 is shown in FIG. 3 as having two paths simply to indicate that the correlation coefficients generated by correlation coefficient engine 220 are correlation coefficients between pairs of pulse data sets received from pulse data set memory 210. More typically, the pulse data sets for which the correlation coefficients are generated are received serially via a single path. Correlation coefficient engine 220 additionally has a correlation coefficient output 224 via which it outputs a respective correlation coefficient calculated for the pulse data sets received from pulse data set memory 210. Finally, correlation coefficient engine 220 has an input/output port 226 connected to controller 250 via which control signals are exchanged between the correlation coefficient engine and the controller.

Comparator 230 has an input 232 connected to the correlation coefficient output 224 of correlation coefficient engine 220 and an enable output 234 connected to an enable input of class memory 240. Comparator 230 additionally has an input/output port 236 connected to controller 250 via which control signals are exchanged between the comparator and the controller.

Class memory 240 has an enable input 242 connected to the enable output 234 of comparator 230 and an input/output port 244 connected to controller 250 via which control signals are exchanged between the class memory and the controller. In an example, class memory 240 is organized as a number of class tables each addressed by a corresponding class table index. Each class table is for storing the block addresses of the pulse data sets assigned to the class defined by the class table index. Alternatively, the class tables may store the pulse data sets assigned to the class all copies of the pulse data sets assigned to the class.

Each of the above-described connections may consist of more than one conductor.

In operation, processor 200 receives the pulse data sets generated by detector 150 (FIG. 2) and stores each of the pulse data sets in pulse data set memory 210 in a respective memory block defined by a block address supplied by controller 250. Once all the pulse data sets have been stored, controller 250 causes pulse data set memory 210 to output two of the stored pulse data sets to correlation coefficient engine 220. In an example, the pulse data sets first output to the correlation coefficient engine are the pulse data sets that were stored in the memory blocks of the pulse data set memory having the lowest and next-lowest block addresses.

Correlation coefficient engine 220 treats the pulse data set received from the memory block with the lowest block address as a reference pulse data set and generates a respective correlation coefficient between the reference pulse data set and each of the remaining pulse data sets received from pulse data set memory 210. In an example, the correlation coefficient engine subtracts each data value of the reference pulse data set from a corresponding data value of the other pulse data set to generate a difference and sums the differences for all the data values of the pulse data sets to generate raw correlation data. Alternatively, the raw correlation data can be generated using ratios or percentage or fractional differences instead of differences. In an embodiment, correlation coefficient engine 220 calculates a covariance between the pulse data sets to provide a raw correlation coefficient. In an example, the covariance between two pulse data sets is given by:

$$\sigma(x, y) = \frac{1}{(P-1)} \sum_i (x_i - \bar{x})(y_i - \bar{y})$$

where P is the number of pulse data points in each pulse data set, $x_i$ and $y_i$ are the values of the i-th pulse data points in pulse data sets x and y, respectively, and $\bar{x}$ and $\bar{y}$ are the means of all the pulse data points in pulse data sets x and y, respectively.

Additionally, normalizing is applied to convert the raw correlation data to a correlation coefficient close to unity or close to 0 for two well-correlated pulse data sets. In the above embodiment, the covariance between the two pulse data sets is divided by the product of the standard deviations of the pulse data sets to generate Pearson's correlation coefficient for the pulse data sets that ranges from 0 for uncorrelated pulse data sets to 1 for perfectly correlated pulse data sets. Correlation coefficient engine 220 outputs the calculated correlation coefficient to comparator 230.

Comparator 230 receives the correlation coefficients generated by correlation coefficient engine 220 and compares each of them with a predetermined threshold. The threshold is related to the way in which the correlation coefficient engine calculates the correlation coefficient and is set to distinguish among the pulse data sets resulting from the respective mode hop sequences of EC-QCL 110 (FIG. 2) or EC-QCL 182 (FIG. 4). Pulse data sets originating from the same mode hop sequence have a correlation coefficient on one side of (e.g., greater than) the threshold whereas pulse data sets originating from different mode hop sequences have a correlation coefficient on the other side of (e.g., less than) the threshold. Comparator 230 generates an enable signal for each correlation coefficient it receives that is greater or less than the threshold, depending on whether well-correlated pulse data sets have a high correlation coefficient or a low correlation coefficient.

Controller 250 provides to class memory 240 a class table index and the block address of the reference pulse data set output to correlation coefficient engine 220 by pulse data set memory 210. In response to a command from controller 250 class memory 240 stores the block address of the reference pulse data set in the class table defined by the current class table index. Additionally, each time it receives an enable signal from comparator 230, class memory 240 stores the block address of pulse data set be compared with the reference pulse data set in the class table defined by the current class table index. Thus, if the pulse data sets stored in the memory blocks with the lowest and next-lowest block addresses originate from the same mode hop sequence of EC-QCL 110, the block address of the memory block with the next-lowest block address is additionally stored in class memory 240 in the class table defined by the current class table index. However, if the pulse data sets stored in the memory blocks with the lowest and next-lowest block addresses originate from different mode hop sequences of EC-QCL 110, only the block address of the memory block with the lowest block address (i.e., the block address of the reference pulse data set) is stored in the class table in class memory 240.

Subsequently, controller 250 causes pulse data set memory 210 to output sequentially the pulse data sets that have not already been allocated to a class to correlation coefficient engine 220. Correlation coefficient engine 220 calculates a correlation coefficient between each pulse data set and the reference pulse data set. Comparator 230 compares each correlation coefficient with the threshold. Class memory 240 stores in the class table for the current class the block addresses of the memory blocks where those of the pulse data sets that are well-correlated with the reference pulse data set are stored.

Controller 250 additionally tracks the block addresses of the memory blocks whose pulse data sets have been assigned to a class. In an example, controller 250 includes a block address table in which are stored the respective block addresses of all the memory blocks in which pulse data sets are stored and a corresponding flag field that, when set, indicates that the pulse data set stored at that block address has been assigned to a class. Initially, none of the flags are set, but as processor 200 assigns block addresses (and, hence, pulse data sets) to classes, the controller sets the respective flags for those block addresses. Thus, when correlation coefficients between the reference pulse data set stored in the first memory block and each of the remaining pulse data sets have been generated, compared with a threshold, and the block addresses of those of the pulse data sets that are well-correlated with the reference pulse data set have been stored in the class table for the first class, the flags linked to the block addresses of those pulse data sets are set.

Once the pulse data sets constituting the first class have been identified, processor 200 operates to identify the pulse data sets that will constitute the second class using operations similar to those just described. Controller 250 increments the class table index and supplies the incremented class table index, i.e., the class table index of the second class, to class memory 240 to indicate that block addresses are to be stored in the class table of the second class. Controller 250 refers to its table of block addresses to find the lowest block address whose pulse data set has not been assigned to a class, i.e., pulse data sets that have not been assigned to the first class when membership of the second class is being determined or pulse data sets that have not been assigned to the first class or the second class when membership of the third class is being determined. Controller 250 commands pulse data set memory 210 to output the pulse data set that is not already a member of a class for correlation coefficient engine 220 to use as a new reference pulse data set. Controller 250 commands class memory 240 to store the block address of the reference pulse data set in the class table for the second class.

Controller 250 again refers to its block address table and causes pulse data set memory 210 to output the next pulse data set that is not already a member of a class to correlation coefficient engine 220. The correlation coefficient engine generates a respective correlation coefficient that comparator 230 compares to the threshold and, if the pulse data sets are well-correlated, causes class memory 240 to store the block address of the memory block where this pulse data set is stored in the class table of the second class.

Processor 200 repeats the process described in the previous paragraph until all of the pulse data sets have been sorted into classes by their block addresses being stored in respective class tables. In some embodiments, controller 250 additionally counts the number of pulse data sets assigned to the current class so that, when assignment of pulse data sets to the current class is complete but the size of the current class is less than a threshold size, the assignment of the pulse data sets to the current class can be reversed.

The number of classes generated by processor 200 corresponds to the number of mode hop sequences used by EC-QCL 110 (FIG. 2) or EC-QCL 182 (FIG. 4) to generate light pulses at its current frequency setting. At other frequency settings, the number of mode hop sequences can be different. It should be noted, however, that processor 200 does not need to be provided with the number of mode hop sequences of the EC-QCL in advance. Using correlation coefficients to sort the pulse data sets into classes automatically results in the pulse data sets being sorted into a number of classes corresponding to the number of mode hop sequences.

Once all (or most) of the pulse data sets have been sorted into classes, the pulse data sets in each of the classes can be subject to additional processing. For example, in response to a command to output the pulse data sets in the first class for further processing, controller 250 reads from the class memory 240 the block addresses stored in the class table of the first class and issues commands to pulse data set memory 210 that cause the pulse data set memory to output the pulse data sets stored at these block addresses. In an example, the pulse data sets in the first class are subject to averaging. A subsequent command causes the pulse data sets in the second class to be output and to be subject to averaging. The averaging operation applied to the pulse data sets in the second class typically produces a result different from the averaging operation applied to the pulse data sets in the first class because the two classes of pulse data sets originate from different mode hop sequences of EC-QCL 110.

Figure 6:
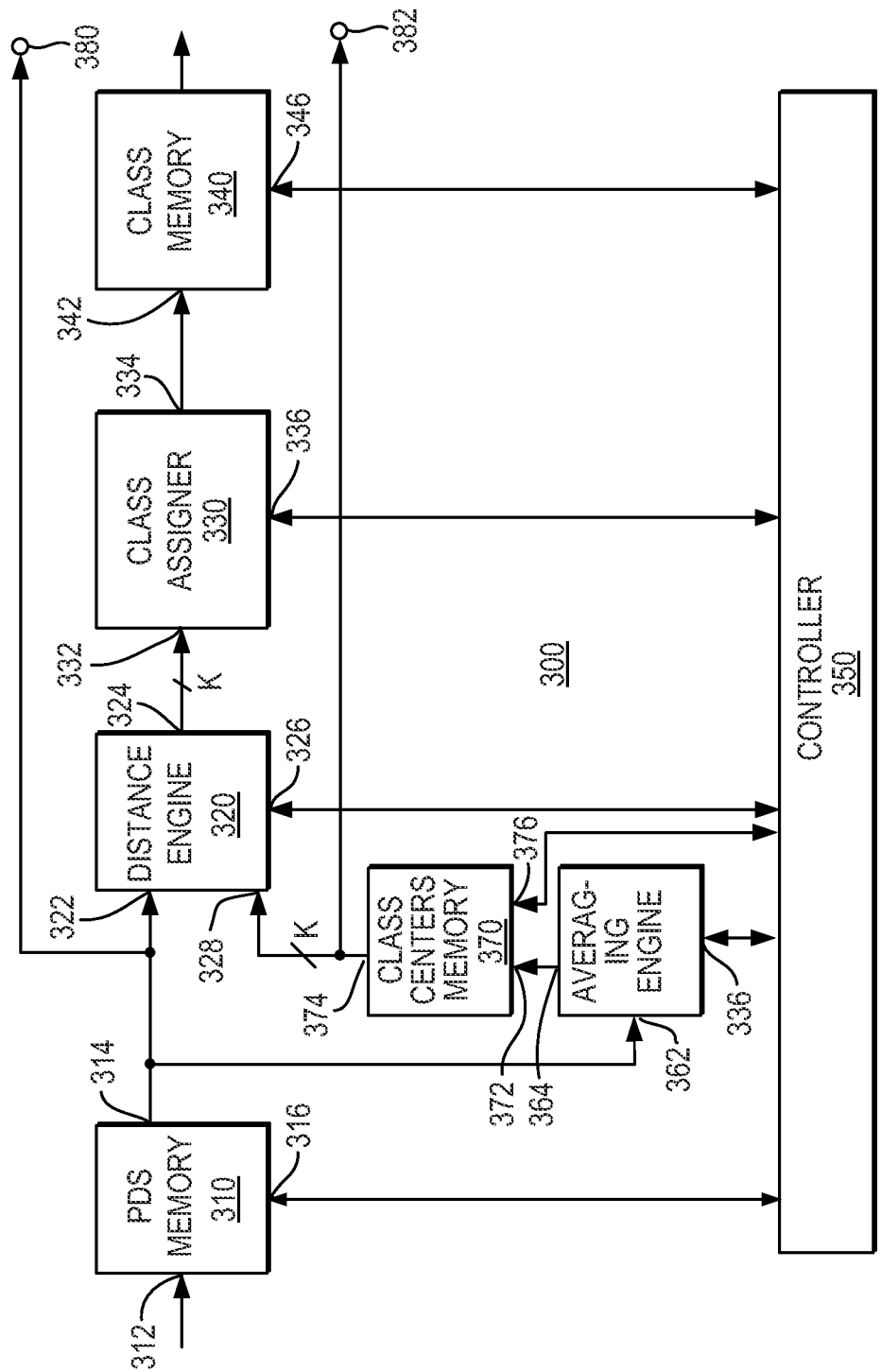
FIG. 6 is a block diagram showing a second example of a processor that may be used as the processor of the heterodyne spectrometer shown in FIG. 2, or the optical instrument shown in FIG. 4.

FIG. 6 is a block diagram showing another example 300 of a processor that may be used as processor 160 in the heterodyne spectrometer 100 described above with reference to FIG. 2 and as processor 188 in the optical instrument 180 described above with reference to FIG. 4. In the example shown, processor 300 uses K-means clustering to identify the pulse data sets that are well correlated so that such pulse data sets can be assigned to the same class. The example of processor 300 shown includes a pulse data set (PDS) memory 310, a distance engine 320, a class assigner 330, a class memory 340 and a controller 350. In a typical embodiment, pulse data set memory 310, class memory 340 and class centers memory 370 are respective portions of a common physical memory.

Pulse data set memory 310 has an input 312 to receive pulse data sets from detector 150 (FIG. 2) during operation of heterodyne spectrometer 100 or from detector 188 (FIG. 4) during operation of optical instrument 180. Pulse data set memory 310 has a pulse data set output 314 to deliver pulse data sets to distance engine 320, averaging engine 360, and a pulse data set output 380. Additionally, pulse data set memory 310 has an input/output port 316 connected to controller 350 via which control signals are exchanged between the pulse data set memory and the controller.

In an example, pulse data set memory 310 is organized into memory blocks each capable of storing a single pulse data set and addressed by a respective block address.

Distance engine 320 has an input 322 via which it receives pulse data sets from pulse data set memory 310. Distance engine 320 additionally has a class centers input 328 via which it receives from class centers memory 370 a respective class center for each of the K classes into which processor 300 will sort the pulse data sets. Distance engine 320 additionally has a distances output 324 via which it outputs sets of K distances. Each distance in the set is a respective distance between the pulse data set currently received from pulse data set memory 310 and each of the class centers received from class centers memory 370. Finally, distance engine 320 has an input/output port 326 connected to controller 350 via which control signals are exchanged between the distance engine and the controller.

Class assigner 330 has an input 332 connected to the distances output 324 of distance engine 320, and a class output 334 connected to deliver a class index for each of the pulse data sets to a class input of class memory 340. Class assigner 330 additionally has an input/output port 336 connected to controller 350 via which control signals are exchanged between the class assigner and the controller.

Class memory 340 has a class input 342 connected to the class output 334 of class assigner 330 and an input/output port 346 connected to controller 350 via which control signals are exchanged between the class memory and the controller. In an example, class memory 340 is organized as a number of class tables each addressed by a corresponding class table index. Each class table is for storing the block addresses of the pulse data sets assigned to the class defined by the class table index. Alternatively, the class tables may store the pulse data sets assigned to the class or copies of the pulse data sets assigned to the class.

Averaging engine 360 has a pulse data set input 362 connected to the pulse data set output 314 of pulse data set memory 310. Averaging engine 360 additionally has an averages output 364 connected to deliver an average for each class to an averages input 372 of class centers memory 370. Finally, averaging engine 360 has an input/output port 366 connected to controller 350 via which control signals are exchanged between the averaging engine and the controller.

Class centers memory 370 has an averages input 372 connected to the averages output 364 of averaging engine 360. Class centers memory 370 additionally has a class centers output 374 via which the class centers memory delivers sets of K class centers to the class centers input 328 distance engine 320. Class centers memory 370 additionally delivers class averages or sets of class averages to class average output 382 via class centers output 374. Finally, class centers memory 370 has an input/output port 376 connected to controller 350 via which control signals are exchanged between the class centers memory and the controller.

Each of the above-described connections may consist of more than one conductor.

In operation, processor 300 receives the pulse data sets generated by detector 150 (FIG. 2) or by detector 188 (FIG. 4) and stores each of the pulse data sets in pulse data set memory 310 in a respective memory block defined by a block address supplied by controller 350. Once all the pulse data sets have been stored, controller 350 causes class centers memory 370 to output a set of K initial class centers to distance engine 320. The initial class centers may be defined randomly or may be defined based on class centers used in previous sorting operations performed by processor 300 or may be defined in some other way. Each class center is a coordinate in P-dimensional space, where P is the number of pulse data points in each pulse data set, that defines the location in the P-dimensional space of the center of the respective class.

Controller 350 then causes pulse data set memory 310 to output each of the stored pulse data sets to distance engine 320. In an example, the pulse data set first output to the distance engine is the pulse data set that was stored in the memory block of the pulse data set memory having the lowest block addresses. For each successive pulse data set output from pulse data set memory 310, the block address is incremented by one.

For each pulse data set received from pulse data set memory 310, distance engine 320 calculates a respective distance in the P-dimensional space between the pulse data set and each of the K initial class centers and outputs the K distances to class assigner 330.

Class assigner 330 receives the K distances generated for each pulse data set by distance engine 320, compares them with one another to identify which of them is smallest and outputs to class memory 340 the class index of the class for which the distance was identified as being the smallest. The smallest distance indicates that the pulse data set is best correlated with the current class center of the identified class. Pulse data sets originating from the same mode hop sequence of the EC-QCL tend to be correlated with the class center of the same class, although at this early stage of the processing, the correlation is imperfect unless the class centers were retained from a previous sorting operation and the settings of the EC-QCL have not been changed in the meantime.

Controller 350 provides to class memory 340 the block address of the current pulse data set output to distance engine 320 by pulse data set memory 310. In response to a command from controller 350, class memory 340 stores the block address of the current pulse data set in the class table defined by the class table index received from class assigner 330.

Once class memory 340 stored the block addresses of the all pulse data sets stored in pulse data set memory 310 in respective class tables in class memory 340 in response to respective class indices received from class assigner 330, controller 350 causes averaging engine 360 to generate a new class center for each class. In this, for each class, controller 350 reads the block addresses stored in the class table for the class stored in class memory 340 and causes pulse data set memory 310 to output to averaging engine 360 the pulse data sets stored at the block addresses retrieved from the class table. Averaging engine 360 performs an averaging operation on the pulse data sets to generate a new class center for the class and outputs the new class center to class centers memory 370. Controller 350 causes class centers memory 370 to update the class center stored for the class with the new class center.

Controller 350 next causes pulse data set memory 310, distance engine 320, class assigner 330, class memory 340, averaging engine 360, and class centers memory 370 operate repetitively as described above each time to generate another set of class centers. In each iteration, distance engine 320 calculates a distance for each pulse data set using the new class centers stored in class centers memory 370 during the previous iteration. Provided that the number of classes K is equal to the number of mode hop sequences of the EC-QCL, the distances between the pulse data sets assigned to each class and the updated class center will decrease between consecutive iterations. This decrease in distance is indicative of an increase in correlation among the pulse data sets assigned to each class. Operations continue until a termination condition has been met. In an example, the operations continue until a defined number of iterations have been performed. In another example, the operations continue until the controller determines that the number of changes in class membership between consecutive iterations has fallen below a defined threshold. This criterion can be tested by providing two class tables for each class in class memory 340 so that a record of class membership in the previous iteration can be preserved. Controller 350 can then compare class membership in the previous iteration with the class membership in the current iteration.

The above-described termination condition can sometimes be met by the above described processing finding one or more local minima instead of respective global minima. To check for this possibility, in some embodiments, controller 350 causes pulse data set memory 310, distance engine 320, class assigner 330, class memory 340, averaging engine 360, and class centers memory 370 to calculate the class centers more than once. The most commonly-occurring results for the class centers are then taken to be the true class centers. In some embodiments, controller 350 additionally causes class centers memory 370 to provide a different set of initial class centers for each calculation of the class centers.

The number of classes generated by processor 300 corresponds to the number of mode hop sequences used by EC-QCL 110 (FIG. 3) or pulsed laser 182 (FIG. 4) to generate light pulses at its current frequency setting. At other frequency settings, the number of mode hop sequences can be different. The number of classes into which processor 300 sorts the pulse data sets needs to be defined in advance. Sorting with a number of classes different from the number of mode hop sequences of the laser makes it unlikely that the termination condition will be met. Controller 350 can be configured to perform testing, e.g., by looking for churning of pulse data sets among the classes, that indicates that the number of classes is incorrect, and can be configured to start over using an increased or decreased number of classes.

Once the termination criterion has been met, the pulse data sets in each of the classes can be subject to additional processing. For example, in response to a command to output the pulse data sets in the first class for further processing, controller 350 reads from class memory 340 the block addresses stored in the class table of the first class and issues commands to pulse data set memory 310 that cause the pulse data set memory to output the pulse data sets stored at these block addresses to pulse data set output 380. However, if the pulse data sets in a selected class are to be subject to averaging, there is no need to output them because an average for each of the classes as currently configured has already been generated by averaging engine 360 and is stored as a class center in class centers memory 370. Class centers memory 370 will output the averages for all of the classes or the average for a selected one of the classes in response to a command received from controller 350. The averaging operation applied to the pulse data sets in each class typically produces a result different from the averaging operations applied to the pulse data sets in the other classes because the classes of pulse data sets originate from different mode hop sequences of EC-QCL 110.

Figure 7:
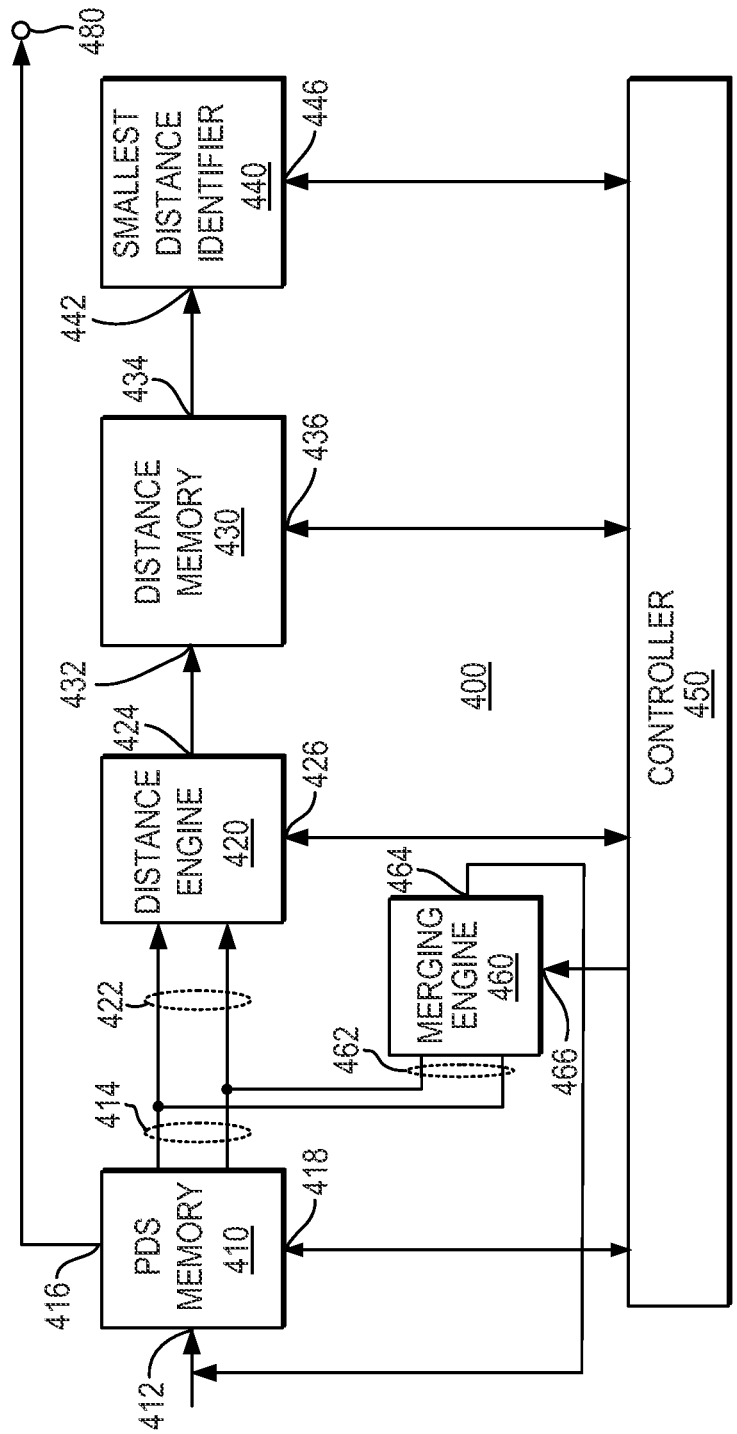
FIG. 7 is a block diagram showing a third example of a processor that may be used as the processor of the heterodyne spectrometer shown in FIG. 2, or the optical instrument shown in FIG. 4.

FIG. 7 is a block diagram showing a third example 400 of a processor that may be used as processor 160 in heterodyne spectrometer 100 described above with reference to FIG. 2 and as processor 188 in optical instrument 180 described above with reference to FIG. 4. In the example shown, processor 400 implements a hierarchical clustering process to identify the pulse data sets that are well correlated so that such pulse data sets can be assigned to the same class. The example of processor 400 shown includes a pulse data set (PDS) memory 410, a distance engine 420, a distance memory 430, a smallest distance identifier 440, a controller 450 and a merging engine 460. In a typical embodiment, pulse data set memory 410 and distance memory 430 are respective portions of a common physical memory.

Pulse data set memory 410 has a pulse data set input 412 to receive pulse data sets from detector 150 (FIG. 2) during operation of heterodyne spectrometer 100 or from detector 188 (FIG. 4) during operation of optical instrument 180 or from merging engine 460. Pulse data set memory 410 has a pulse data set output 414 to deliver pulse data sets to distance engine 420 and to merging engine 460. Pulse data set output 414 is shown in FIG. 7 as having two paths to simply to indicate that the distances generated by distance engine 420 are distances between pairs of pulse data sets received from the pulse data set memory, and that merging engine 460 merges pairs of pulse data sets. More typically, the pulse data sets for which the distances are generated are output serially via a single path. Pulse data set memory 410 additionally has a pulse data set output 416 connected to a pulse data set output 480 via which all the pulse data sets sorted into a given class are output at the end of a sorting operation. Finally, pulse data set memory 410 has an input/output port 418 connected to controller 450 via which control signals are exchanged between the pulse data set memory and the controller.

In an example, pulse data set memory 410 is organized into memory blocks each capable of storing a single pulse data set and addressed by a respective block address.

Distance engine 420 has an input 422 via which it receives pulse data sets from pulse data set memory 410. Input 422 is shown in FIG. 7 as having two paths simply to indicate that the distances calculated by distance engine 420 are distances between pairs of pulse data sets received from pulse data set memory 410. More typically, the pulse data sets for which the distances are calculated are received serially via a single path. Distance engine 420 additionally has a distance output 424 via which it outputs a respective distance calculated for the pairs of pulse data sets received from pulse data set memory 410. Finally, distance engine 420 has an input/output port 426 connected to controller 450 via which control signals are exchanged between the distance engine and the controller.

Distance memory 430 has a distance input 432 connected to receive distances from the distance output 424 of distance engine 420 and a distance output 434 connected to deliver distances read from distance memory 430 to a distance input of smallest distance identifier 440. Distance memory 430 additionally has an input/output port 436 connected to controller 450 via which control signals are exchanged between the distance memory and the controller. In an example, distance memory 430 is organized as a square array in which the cell in which is stored the distance between two pulse data sets is addressed in the row direction and the column direction by addresses derived from the respective block addresses of the pulse data sets.

Smallest distance identifier 440 has a distance input 442 connected to receive distances from the distance output 434 of distance memory 430 and an input/output port 446 connected to controller 450 via which control signals are exchanged between the smallest distance identifier and the controller.

Merging engine 460 has a pulse data set input 462 connected to receive the pairs of pulse data sets that are to be merged from the pulse data set output 414 of pulse data set memory 410. Merging engine 460 additionally has a merged pulse data set output 464 via which it delivers merged pulse data sets to the pulse data set input 412 of pulse data set memory 410. Finally, merging engine 460 has an input/output port 466 connected to controller 450 by which control signals are exchanged between the merging engine and the controller.

Each of the above-described connections may consist of more than one conductor.

In operation, processor 400 initially receives the pulse data sets generated by detector 150 (FIG. 2) or by detector 188 (FIG. 3) and stores each of the pulse data sets in pulse data set memory 410 in a respective memory block defined by a block address supplied by controller 450. Once all the pulse data sets have been stored, controller 450 causes pulse data set memory 410 to output one of the stored pulse data sets to distance engine 420. In an example, the pulse data set first output to the distance engine are the pulse data sets that were stored in the memory blocks of the pulse data set memory having the lowest block address. Controller 450 then causes pulse data set memory 410 to output the remaining pulse data sets stored therein sequentially to distance engine 420.

Distance engine 420 treats the pulse data set first received as a reference pulse data set and calculates a respective distance between the reference pulse data set and each of the pulse data sets subsequently received from pulse data set memory 410. A small distance between two pulse data sets is indicative of the pulse data sets being generated using the same mode hop sequence of EC-QCL 110 whereas a larger distance is indicative of the pulse data sets being generated using different mode hop sequences of the EC-QCL. Once the distance engine has calculated distances between the first pulse data set received and each of the remaining pulse data sets, controller 450 causes pulse data set memory 410 to output the pulse data set at the second-lowest block address for the distance engine to use as a reference pulse data set and then causes pulse data set memory 410 to output sequentially the pulse data sets at block addresses higher than that of the reference pulse data set. The process of outputting a reference pulse data set followed by a sequence of all the pulse data sets at block addresses greater than that of the reference pulse data set continues until distance engine 420 has calculated respective distances between each of the pulse data sets and each other of the pulse data sets stored in pulse data set memory 410. Distance engine 420 outputs each calculated distance to distance memory 430.

Distance memory 430 receives each of distances calculated by distance engine 420 and additionally receives from controller 450 the block addresses of the pair of pulse data sets to which the distance pertains. Distance memory 430 stores each distance linked to its corresponding block addresses.

Concurrently with the distances being stored in distance memory 430, or after all the distances have been stored in distance memory 430, controller 450 provides pairs of block addresses to distance memory 430 and to smallest distance identifier 440. Each pair of block addresses provided to the distance memory causes the distance memory to output to smallest distance identifier 440 the respective distance stored in the distance memory at the address defined by the pair of block addresses. Outputting continues until respective distances between each of the pulse data sets stored in pulse data set memory 410 and each other of the pulse data sets stored in the pulse data set memory have been output.

Smallest distance identifier 440 assigns the first distance received from distance memory 430 and the block addresses received from controller 450 and corresponding to the first distance to a temporary memory. Smallest distance identifier 440 then compares each subsequent distance it receives from distance memory 430 with the distance stored in a temporary memory. When the subsequently-received distance is larger than the stored distance, the smallest distance identifier does nothing. When the subsequently-received distance is smaller than the stored distance, the smallest distance identifier overwrites the distance and block addresses stored in the temporary memory with the subsequently-received distance and its corresponding block addresses. When all of the distances have been processed by smallest distance identifier 440, controller 450 causes the smallest distance identifier to output the smallest distance and the block addresses of the corresponding pulse data sets from its temporary memory to the controller.

Controller 450 forwards the block addresses received from smallest distance identifier 440 to pulse data set memory 410 and commands the pulse data set memory to output the pulse data sets stored at the block addresses to merging engine 460. Merging engine 460 merges the pulse data sets that have the smallest distance between them to form a merged pulse data set and outputs the merged pulse data set to pulse data set memory 410. In an example, merging engine 460 merges the pulse data sets by averaging them to generate a merged pulse data set that is the average of the pulse data sets subject to merging. Other ways of merging pulse data sets are known and may be implemented by merging engine 460. Controller 450 provides a block address and a command to pulse data set memory 410 that causes the pulse data set memory to store the merged pulse data set at the block address provided. The merged pulse data set constitutes the beginning of a class. Typically, merging engine 460 will later merge other pulse data sets and/or other merged pulse data sets with the merged pulse data set to increase the size the class. Merging two pulse data sets that have not previously been merged forms a new class. Merging a merged pulse data set with a pulse data set that has not previously been merged increases the size of the class corresponding to the merged pulse data set. Merging two merged pulse data sets forms a new class that supersedes the classes represented by the constituent merged pulse data sets.

To keep track of the pulse data sets that are merged into each merged pulse data set, controller 450 keeps a class table for each merged pulse data set. Controller 450 stores in the class table the block addresses of the pulse data sets that are merged to form each merged pulse data set. In applications in which hierarchical information is of interest, controller 450 additionally stores in each class table information indicating the processing cycle in which each pulse data set was merged into the class.

In an example in which merging engine 460 merges two merged pulse data sets by averaging them or merges a pulse data set with a merged pulse data set by averaging them, the merging engine performs averaging that is weighted in accordance with the number of pulse data sets that have been merged to form each merged pulse data set. In another example in which merging engine 460 merges two merged pulse data sets by averaging them or merges a pulse data set with a merged pulse data set by averaging them, the averaging engine averages the pulse data sets identified by the class table kept by controller 450 as being constituents of each merged pulse data set.

Controller 450 next causes pulse data set memory 410 to output the merged pulse data set that it has just stored to distance engine 420 as a reference pulse data set and additionally causes pulse data set memory 410 to output sequentially to distance engine 420 each other pulse data set stored in pulse data set memory 410. Distance engine 420 calculates a difference between the merged pulse data set and each pulse data set it subsequently receives and outputs the resulting distance to distance memory 430. Distance memory 430 replaces the distances stored therein for the pulse data sets that were merged with the distances calculated for the merged pulse data set. Distance memory 430 stores each distance for the merged pulse data set at an address derived from its corresponding block addresses, as described above. Replacing the distances stored in distance memory 430 for the pulse data sets that were merged with the distances calculated for the merged pulse data set reduces the size of the array of distances stored in the distance memory by one row and one colon.

Distance memory 430 then sequentially outputs the distances stored therein sequentially to smallest distance identifier 440 in a manner similar to that described above. However, this time, distance memory 430 outputs the newly-calculated distances for the merged pulse data set instead of the distances for the pair of pulse data sets that were merged to form the merged pulse data set. As a result, smallest distance identifier identifies another pair of pulse data sets for which the distance smallest. These pulse data sets may be previously-unmerged pulse data sets (indicating the start of another class) or of one of the pulse data sets may be the recently-formed merged pulse data set (indicating an increase in the size of an existing class).

Merging engine 460, pulse data set memory 410, distance engine 420, distance memory 430, and smallest distance identifier 440 operate cyclically in response to commands from controller 450. During each cycle, merging engine 460 merges the pair of pulse data sets identified by smallest distance identifier 440 as having the smallest distance between them. During each cycle, the size of an existing class may increase by one, or a new class may be formed. During each cycle, after smallest distance identifier 440 identifies the smallest distance between the pulse data sets that have valid distances stored in distance memory 430, controller 450 compares the size of the smallest distance with a threshold that defines the lowest-acceptable correlation among the pulse data sets sorted into each class. When the smallest distance exceeds the threshold, controller 450 terminates the sorting process.

Each of the merged pulse data sets stored in pulse data set memory 410 is a merged pulse data set for a respective class. In an embodiment in which pulse data sets are merged by averaging them, each of the merged pulse data sets is an average pulse data set for the class. In applications in which the purpose of the processing performed by processor 400 is to generate an average of the pulse data sets in each class, controller 450 provides the block address where the merged pulse data set of a class of interest is stored pulse data set memory 410 to cause the pulse data set memory to output the average for the class of interest to pulse data set output 480. In applications in which the pulse data sets themselves are of interest, controller 450 refers to the class table for the class of interest and provides respective block addresses and a command to pulse data set memory 410 that cause the pulse data set memory to output the pulse data sets constituting the class to pulse data set output 480 for further processing.

The embodiments of processors 160, 200, 300, 400 and elements thereof described in this disclosure may be constructed from discrete components, small-scale or large-scale integrated circuits, suitably-configured application-specific integrated circuits (ASICs) or field-programmable gate arrays (FPGAs) and/or other suitable hardware. Alternatively, processors 160, 200, 300, 400 and the elements thereof may be constructed using a digital signal processor (DSP), microprocessor, microcomputer or computer with internal or external memory operating in response to a sorting program fixed in a computer-readable medium. A device, such as a DSP, a microprocessor, microcomputer or computer, capable of executing a sorting program will be referred to herein as a computer.

In computer-based embodiments, the various modules described herein may be ephemeral, and may only exist temporarily as the program executes. In such embodiments, the program could be conveyed to the computer on which it is to run by embodying the program in a suitable computer-readable medium, such as a set of floppy disks, a CD-ROM, a DVD-ROM, a BD-ROM, a flash drive, or a read-only memory. Alternatively, the program could be transmitted to the computer on which it is to run from a computer-readable medium in another computer by a suitable physical or wireless data link, and be stored in a memory device in the computer on which it is to run.

Figure 8:
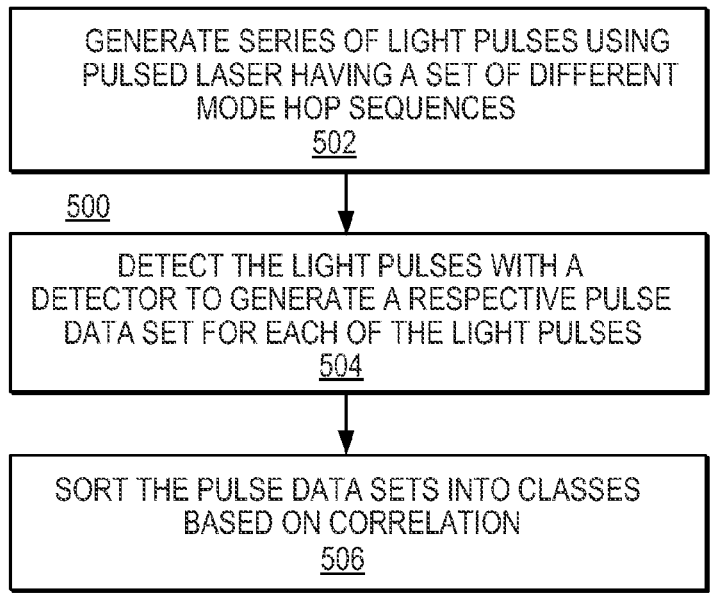
FIG. 8 is a flowchart showing an example of an optical measurement method in accordance with an embodiment.

FIG. 8 is a flowchart showing an example 500 of an optical measurement method in accordance with an embodiment. In the example shown, in block 502, a series of light pulses is generated using a mode-hopping pulsed laser having a set of different mode hop sequences. In block 504, the light pulses are detected with a detector to generate a respective pulse data set for each of the light pulses. In block 506, the pulse data sets are sorted into classes based on correlation. Once sorted into classes, the pulse data sets in each of the classes can be subject to further processing, such as averaging.

Figure 9:
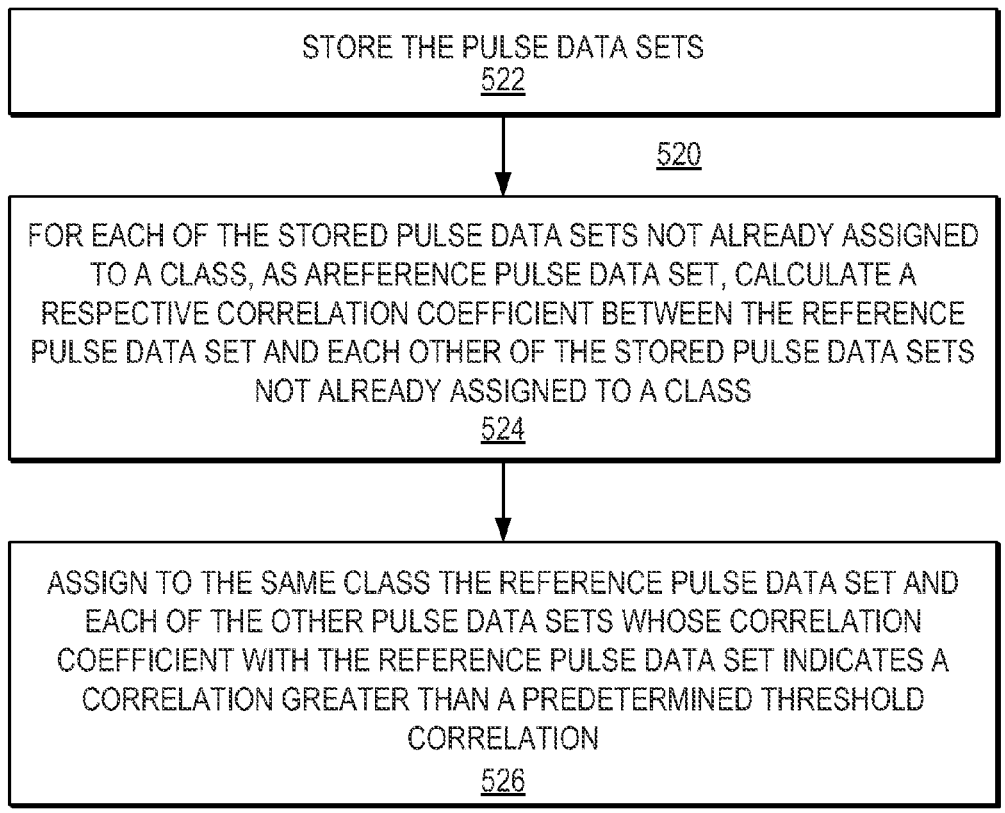
FIG. 9 is a flowchart showing an example of the processing performed in the method shown in FIG. 8 to sort the pulse data sets into classes based on correlation.

FIG. 9 is a flowchart showing an example 520 of the processing performed in block 506 of method shown in FIG.

6 to sort the pulse data sets into classes based on correlation. In this example, correlation coefficients among the pulse data sets are calculated to identify those of the pulse data sets that are well correlated with one another and therefore should be assigned to the same class. In the example shown, in block 522, the pulse data sets generated in block 504 of FIG. 6 are stored. In block 524, for each of the stored pulse data sets not already assigned to a class, referred to as a reference pulse data set, a respective correlation coefficient is calculated between the reference pulse data sets and each other of the stored pulse data sets not already assigned to a class. Finally, in block 526, the reference pulse data set and each of the other pulse data sets whose correlation coefficient with the reference pulse data set indicates a correlation greater than a predetermined threshold correlation are assigned to the same class.

Figure 10:
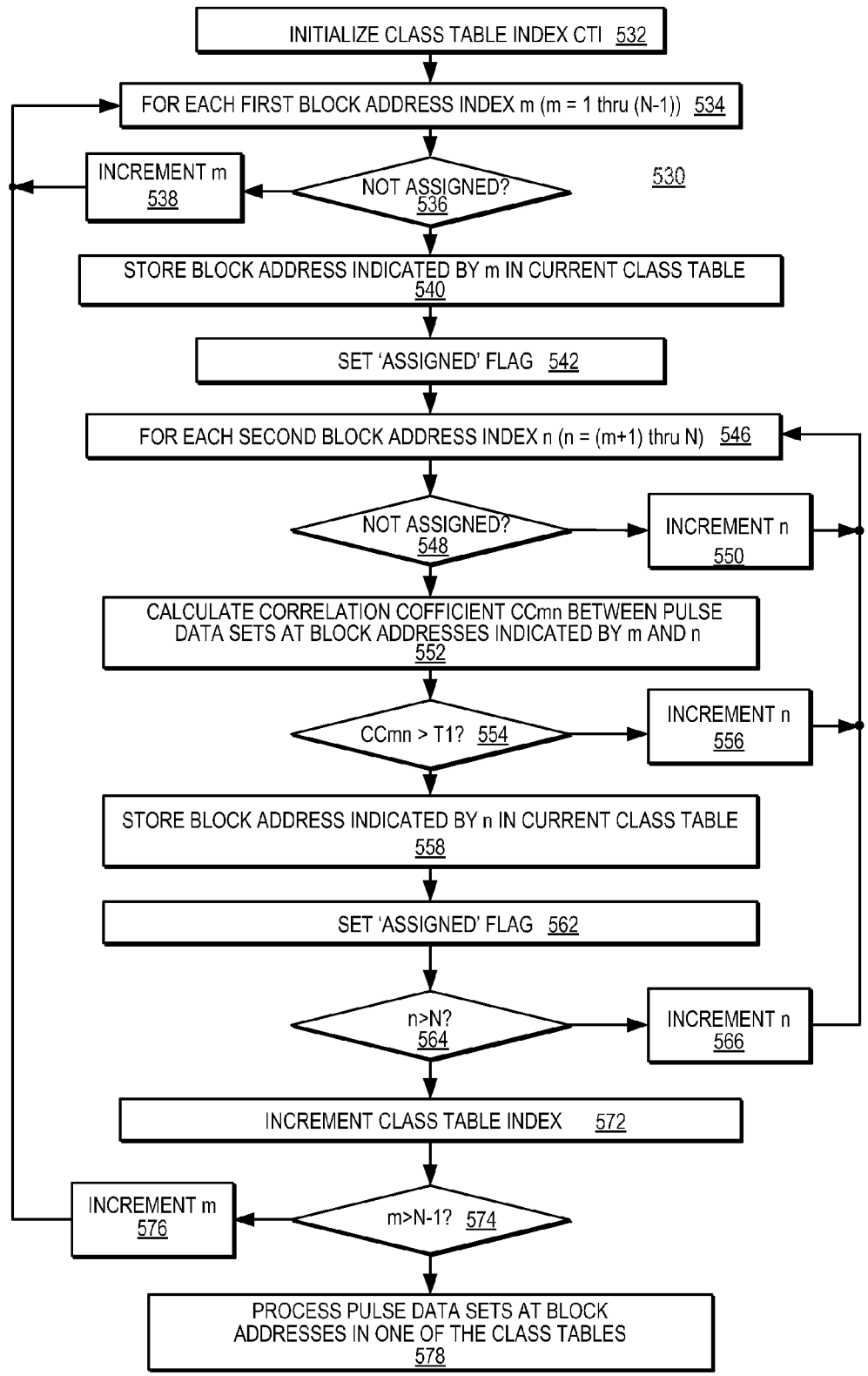
FIG. 10 is a flowchart showing in greater detail an example of the processing performed in FIG. 9.

FIG. 10 is a flowchart showing in greater detail an example 530 of the processing performed in blocks 524 and 526 of FIG. 9. In this example, it is assumed that each pulse data set received from detector 150 (FIG. 2) is stored in a respective block of a memory, and the blocks have respective block addresses tracked by two block address indices. A first block address index m tracks the block address of each pulse data sets that is used as a reference pulse data set, and a second block address index n tracks the block address of each pulse data set for which a correlation coefficient with the reference pulse data set is determined. The first block address index m ranges from 1 through N−1, where N is the number of pulse data sets stored in block 522 (FIG. 7). The second block address index n ranges from m+1 through N. A class table for each class is used to store the block addresses of the memory blocks in which are stored the pulse data sets belonging to the class. A class table index is used to track the class tables. Flags linked to the block addresses are used to track whether the process has previously assigned the corresponding pulse data sets to a class.

In the example shown in FIG. 8, in block 532, the class table index is initialized. In its initialized state, the class table index indicates the class table of the first class.

In block 534, a first loop is established that progressively increments first block address index m from 1 through N−1.

In block 536, a test is performed to determine whether the pulse data set at the block address indicated by first block address index m has not already been assigned to a class. The test is unnecessary during the first iteration of the first loop but is nevertheless performed during the first iteration of the first loop for simplicity.

A NO result in block 536 causes execution to advance to block 538, where the value of first block address index m is incremented by one. Execution and then returns to block 534, where the next iteration of the first loop begins.

A YES result in block 536 causes execution to advance to block 540, where the block address indicated by the current value of first block address index m is stored in the class table indicated by the current value of the class table index.

In block 542, the flag linked to the block address indicated by first block address index m is set to indicate that the pulse data set at this block address has now been assigned to a class.

In block 546, a second loop is established that progressively increments second block address index n from m+1 through N.

In block 548, a test is performed to determine whether the pulse data set at the block address indicated by second block address index n has not already been assigned to a class. The test is unnecessary during the 1st iteration of the loop that begins at block 546 but is nevertheless performed during the first iteration of the second loop for simplicity.

A NO result in block 548 causes execution to advance to block 550 where the value of second block address index n is incremented by one. Execution then returns to block 546 where the next iteration of the 2nd loop begins.

A YES result in block 548 causes execution to advance to block 552, where a correlation coefficient between the pulse data sets at the block addresses indicated by first block address index m and second block address index n is calculated.

In block 554, a test is performed to determine whether the correlation coefficient calculated in block 552 indicates that the pulse data sets at the block addresses indicated by first block address index m and second block address index n are well-correlated. In an example, the pulse data sets are well-correlated when the correlation coefficient between them is greater than a predetermined threshold correlation coefficient T1. In another, the pulse data sets are well-correlated when the correlation coefficient between them is less than a predetermined threshold correlation coefficient T1.

A NO result in block 554 causes execution to advance to block 556 where the value of second block address index n is incremented by one. Execution than advances to block 546, where the next iteration of the 2nd loop begins. When a NO result is obtained in block 554, the block address indicated by second block index n is not stored in the class table indicated by the current value of the class table index and, hence, the pulse data set at this block address is not assigned to the class.

A YES result in block 554 causes execution to advance to block 558, where the block address indicated by second block address index n is stored in the class table indicated by the current value of the class table index. As a result, the pulse data set at this block address is assigned to the class.

In block 562, a flag linked to the block address indicated by second block address index n is set to indicate that the pulse data set at this address has now been assigned to a class.

In block 564, a test is performed to determine whether the current value of second block address index n is greater than N, the number of pulse data sets stored.

A NO result in block 564 causes execution to advance to block 566, where the value of second block address index n is incremented by one. Execution then returns to block 546, where the next iteration of the second loop begins. In each iteration of the second loop, a respective correlation coefficient between the reference pulse data set at the block address indicated by first block address index m and the pulse data set at the block address indicated by the new value of second block address index n is calculated.

A YES result in block 564 indicates that correlation coefficients between the reference pulse data set at the block address indicated by first block address index m and all of the other pulse data sets not already assigned to a class have been calculated. The YES result in block 564 causes execution to advance to block 572, where the class table index is incremented by one to select the next class table.

In block 574, a test is performed to determine whether first pulse data set index m is greater than N−1.

A NO result in block 574 causes execution to advance to block 576, where the value of first block address index m is incremented by one block. Execution then returns to block 534, where the next iteration of the first loop begins. In this next iteration of the 1st loop, a respective correlation coefficient is calculated between the reference pulse data set at the block address indicated by the new first block address index m and the pulse data set at each block address indicated by the value of second block address index n and that has not already been assigned to a class in a previous iteration of the first loop.

A YES result in block 574 indicates that, for each one of the stored pulse data sets not already assigned to a class, as a reference pulse data set, a respective correlation coefficient has been calculated between the reference pulse data set and each other of the stored pulse data sets not already assigned to a class, and that an assignment of the other pulse data set to a class has or has not been made depending on the calculated correlation coefficient.

In block 578, the pulse data sets stored at the block addresses stored in one of the class tables are subject to processing, such as averaging or selection.

Figure 11:
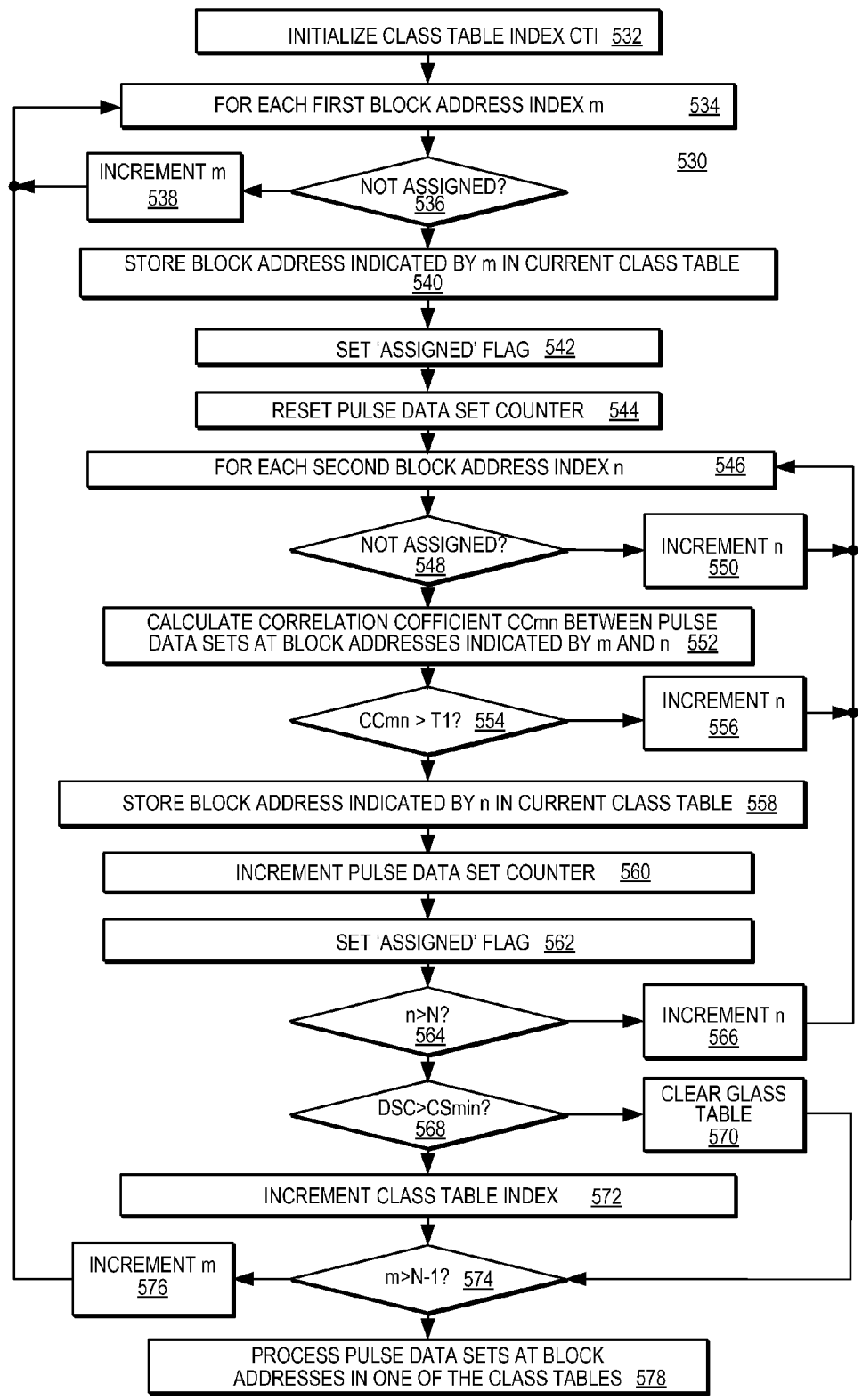
FIG. 11 is a flowchart showing an example of the processing performed in FIG. 10 to eliminate classes constituted of fewer than a predetermined number of pulse data sets.

In some applications, it is desirable to define a minimum number of pulse data sets that may constitute a class. FIG. 11 is a flowchart showing an example 590 of the processing performed in blocks 524 and 526 of FIG. 9 when the minimum size of the class is defined. A pulse data set counter is used to track the number of pulse data sets assigned to the class indicated by the current class table index. Elements of FIG. 11 that correspond to elements of FIG. 10 are indicated using the same reference numerals and will not be described again here.

In block 534, the maximum value of the first block address index m is less than the total number N of pulse data sets stored by the minimum class-size $CS_{min}$, i.e., the minimum number of pulse data sets that may constitute a class.

In block 544, the pulse data set counter that counts the number of pulse data sets assigned to the current class is reset.

In block 560, a YES result in block 554 additionally causes the pulse data set counter to be incremented by one.

A YES result in block 564 causes execution to advance to block 568, where a test is performed to determine whether the number of pulse data sets in the current class indicated by the pulse data set counter exceeds minimum class size $CS_{min}$.

A NO result in block 568 causes execution to advance to block 570, where the block addresses stored in the current class table are cleared. Execution then advances to block 574, skipping block 572. As a result, the class table index is not incremented and the class table indicated by the current value of the class table index is repopulated on the next iteration of the first loop.

Other sorting methods may be used. For example correlation coefficients between each pulse data set and each other of the pulse data sets may be calculated and stored, for example, in a two-dimensional array. A column of the array is then searched for correlation coefficients that indicate well-correlated pairs of pulse data sets, the block addresses of the corresponding pulse data sets are added to a class table, and all the correlation coefficients relating to the pulse data sets whose block addresses were added to the class table are removed from the table. The next column of the array is then searched to add block addresses to another class table.

Figure 12:
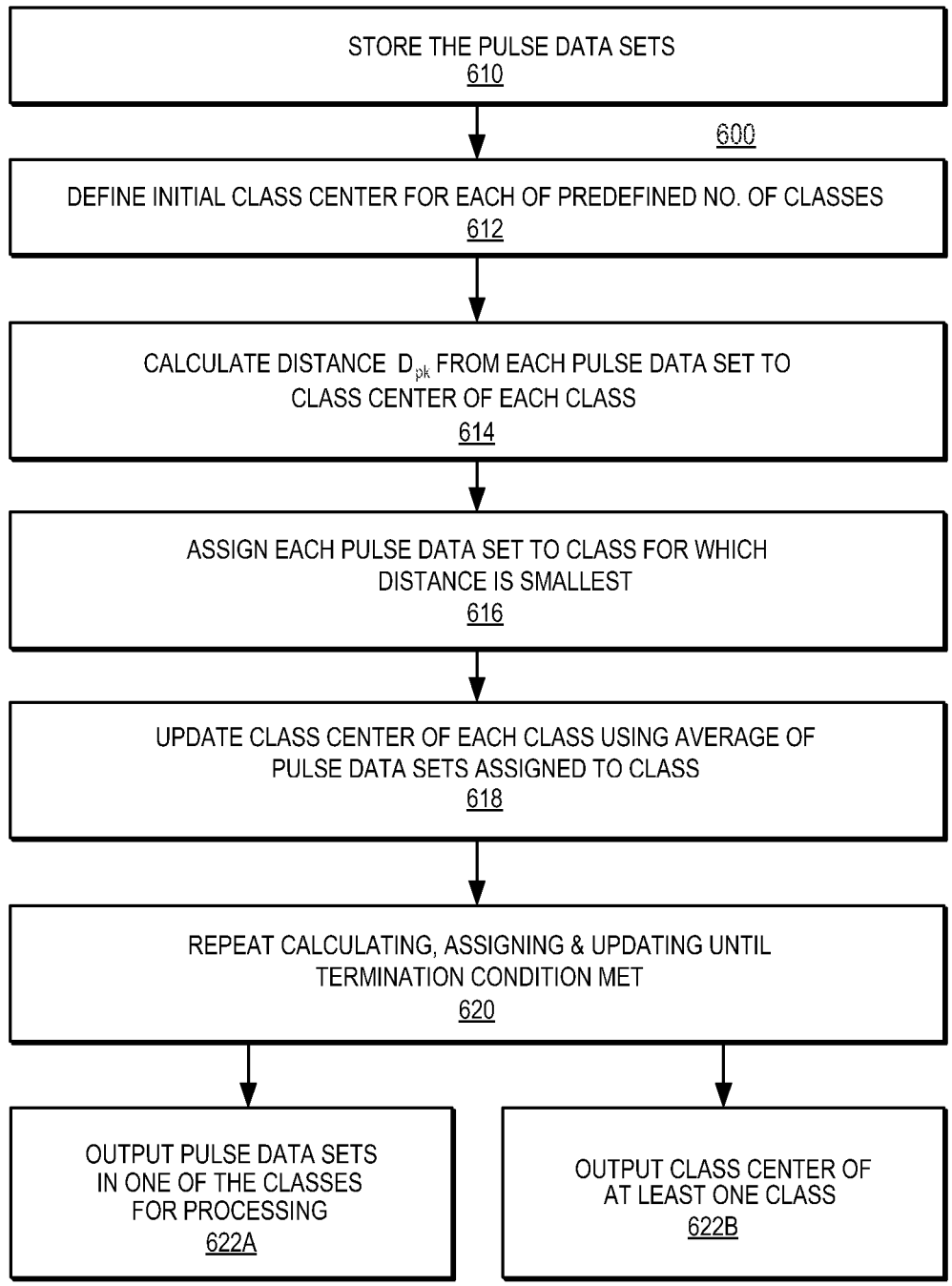
FIG. 12 is a flowchart showing another example of the processing performed in the method shown in FIG. 8 to sort the pulse data sets into classes based on correlation.

FIG. 12 is a flowchart showing another example 600 of the processing performed in block 506 of method shown in FIG. 8 to sort the pulse data sets into classes based on correlation. The processing is based on what is known as K-means clustering. In this example, no correlation coefficients among the pulse data sets are calculated but the number of classes into which the pulse data sets will be sorted has to be defined in advance. The processing refers to a P-dimensional space, where P is the number of pulse data points in each pulse data set.

In the example shown, in block 610, the pulse data sets generated in block 504 of FIG. 8 are stored. In block 612, an initial class center for each of the classes is defined in the P-dimensional space. In some embodiments, the initial class centers are defined based on known properties of the EC-QCL. In other embodiments, the initial class centers are randomly assigned or are based on class centers used in previous sorting operations. Alternatively, other techniques may be used to define the initial class centers.

In block 614, a distance in the P-dimensional space between each pulse data set and the class center of each class is calculated. Thus, if there are K classes. K distances are calculated for each pulse data set.

In block 616, each pulse data set is assigned to the class for which the distance calculated in block 614 is smallest.

In block 618, once all the pulse data sets have been assigned to classes, the class center in the P-dimensional space of each class is updated using the average of the pulse data sets assigned to the class.

In block 620, the until a termination condition is met. For example, the termination condition may be met when the pulse data sets assigned to each of the classes does not change significantly between subsequent iterations. In another example, the termination condition is the performance of a defined number of iterations.

The termination condition can sometimes be met by the above described processing finding one or more local minima instead of respective global minima. To check for this possibility, in some embodiments, the processing sequence described above with reference to blocks 614, 616, 618 and 620 is repeated more than once. The most commonly-occurring results for the class centers are then taken to be the true class centers. In some embodiments, the sequence that is repeated additionally includes block 612, where a set of different initial class centers is defined for each repetition.

Optionally, tests may be performed in block 620 to determine whether the processing is converging on a solution so that if the processing is not converging, process can be stopped and subsequently restarted using a different number of classes.

In block 622A, the pulse data sets assigned to one of the classes in the most recent performance of block 616 are output for processing. Alternatively, when block 506 of the method shown in FIG. 8 is performed to average the pulse data sets, the most recently updated class center of a specified class generated in block 618 can be output as an average for the class.

Figure 13:
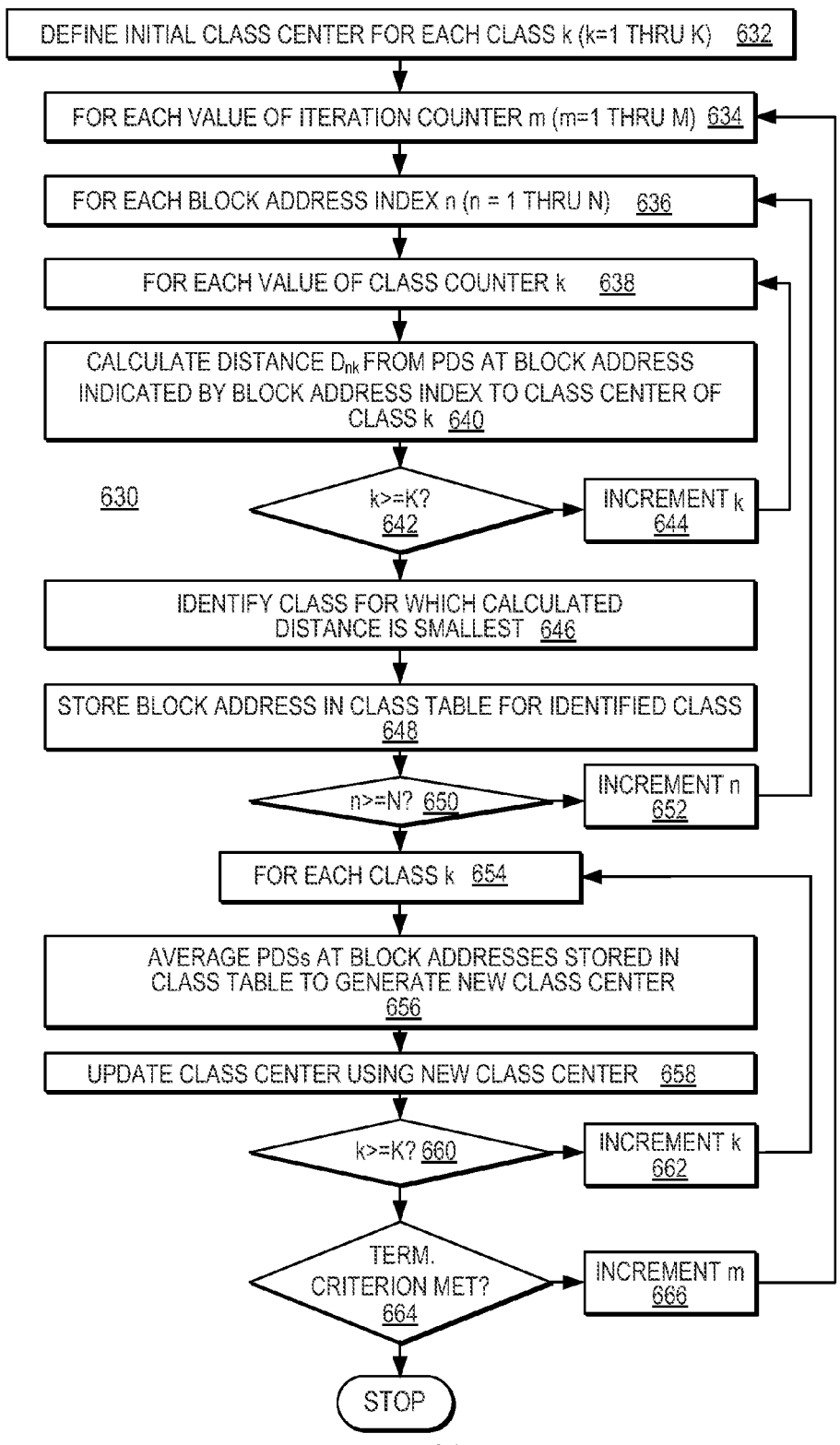
FIG. 13 is a flowchart showing in greater detail an example of the processing performed in FIG. 12.

FIG. 13 is a flowchart showing in greater detail an example 630 of the processing performed in blocks 610 through 620 of FIG. 12. In block 632, an initial class center for each class is defined as described above.

In block 634, a first loop is established that progressively increments and iteration counter m from 1 through M.

In block 636, a second loop is established that progressively increments a block address index n from 1 to N, where N is the number of pulse data sets stored in the pulse data set memory.

In block 638, a third loop is established that progressively increments a class counter k from 1 to K, where K is the number of classes for which initial class centers were defined in block 632.

In block 640, a distance is calculated between the pulse data set at the block address indicated by the current value of block address index n and the class center of current class k.

In block 642, a test is performed to determine whether the current value of class counter k is greater than or equal to the number of classes K. A NO result in block 642 causes execution to advance to block 644, where class counter k is incremented by 1. Execution then returns to block 638, where processing of the next class begins. A YES result in block 642 causes execution to advance to block 646, where the class for which the distance calculated in block 640 is smallest is identified.

In block 648, the block address indicated by the current value of the block address index n is stored in the class table for the class identified in block 646.

In block 650, a test is performed to determine whether the current value of block address index n is greater than or equal to the number of stored pulse data sets N. A NO result in block 650 causes execution to advance to block 652, where block address index n is incremented by 1.

Execution then returns to block 636, where processing of the next pulse data set begins. A YES result in block 650 causes execution to advance to block 654, where a new loop is established that progressively increments class counter k from 1 to K, where K is the number of classes for which initial class centers were defined in block 632.

In block 656, the pulse data sets stored at the block addresses stored in the class table for the current class k are averaged to generate a new class center for the current class.

In block 658, the class center for the current class k is updated using the new class center generated in block 656.

In block 660, a test is performed to determine whether the current value of class counter k is greater than or equal to the number of classes K. A NO result in block 660 causes execution to advance to block 662, where class counter k is incremented by 1. Execution then returns to block 654, where processing of the next class begins. A YES result in block 660 causes execution to advance to block 664.

In block 664, a test is performed to determine whether a termination criterion has been met. Examples of termination criteria that may be used are described above. A NO result in block 664 causes execution to advance to block 666, where iteration counter m is incremented by 1. Execution then returns to block 634, where processing of the next iteration begins. A YES result in block 664 causes execution to stop.

As noted above, the most-recently updated class centers represent averages for the classes and may be output as such. If processing other than averaging is to be applied to the pulse data sets in each class, the pulse data sets in a selected class are read out from the bulk pulse data set memory by referring to the class table for the class.

Figure 14:
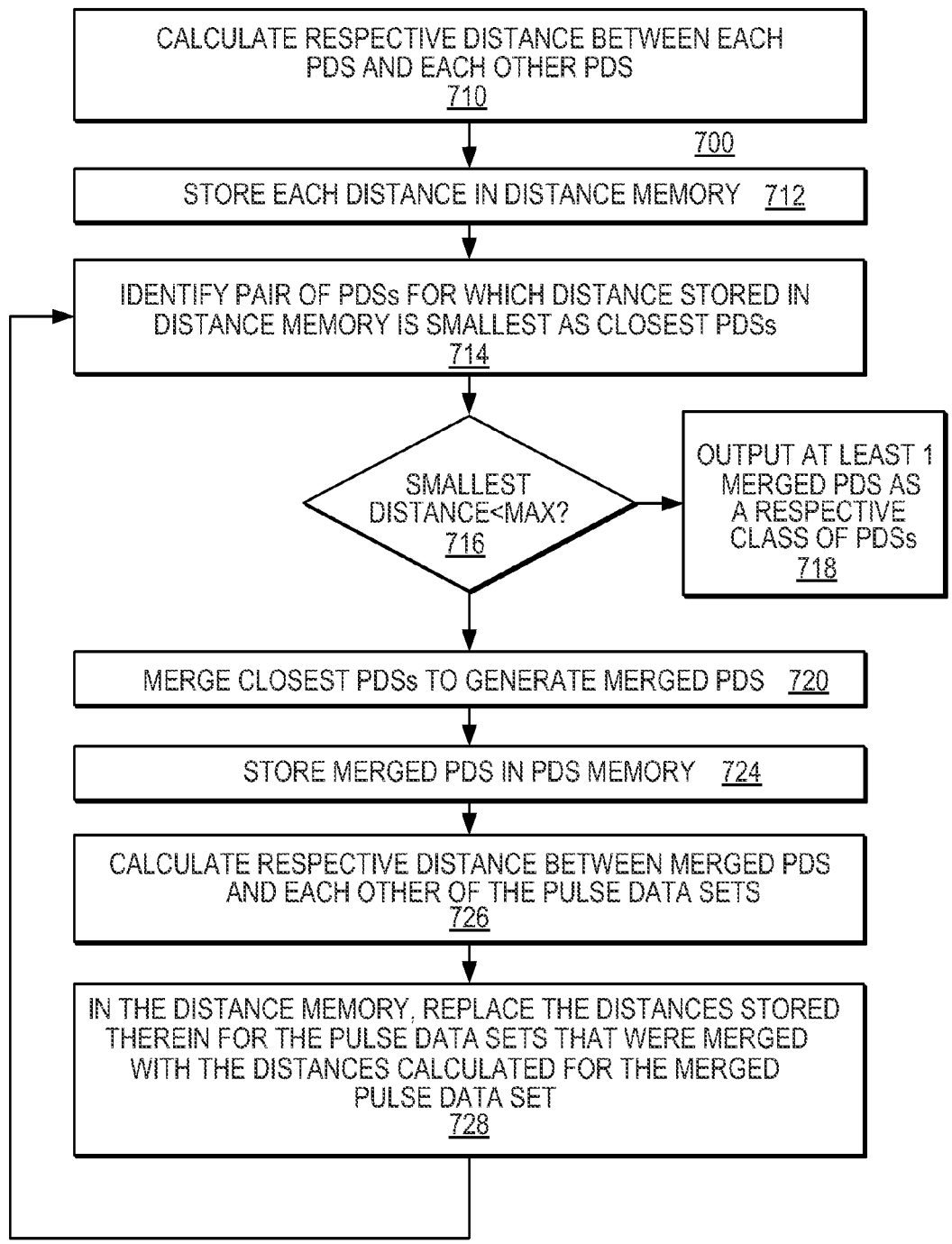
FIG. 14 is a flowchart showing yet another example of the processing performed in the method shown in FIG. 8 to sort the pulse data sets into classes based on correlation.

FIG. 14 is a flowchart showing another example 700 of the processing performed in block 506 of method shown in FIG. 8 to sort the pulse data sets into classes based on correlation. In this example, a hierarchical clustering process is used to identify those of the pulse data sets that are well correlated with one another and therefore should be assigned to the same class.

In block 710, a respective distance is calculated between each pulse data set stored in a pulse data set memory and each other pulse data set stored in the pulse data set memory.

In block 712, each distance calculated in block 710 is stored in a distance memory.

Block 714 is the beginning of a loop that includes blocks 714, 716, 720, 724, 726 and 728. In block 714, a pair of pulse data sets for which the distance stored in the distance memory is smallest is identified as a closest pair of pulse data sets.

In block 716, a test is performed to determine whether the distance identified as the smallest distance in block 714 is less than a maximum allowed distance. The maximum allowed distance is indicative a minimum allowed correlation among the pulse data sets assigned to a class. A NO result in block 716 (smallest distance greater than maximum allowed) causes the sorting operation to stop and execution to advance to block 718, where at least one of the merged pulse data sets is output as a respective class of pulse data sets. In an example in which pulse data sets are merged by averaging them, as described below, each of the merged pulse data sets is an average pulse data set for the class. In applications in which the purpose to generate an average of the pulse data sets in each class the merged pulse data set of a class of interest is output as the average for the class of interest. In applications in which the pulse data sets belonging to a specified class are of interest, the pulse data sets constituting the class are output.

A YES result in block 716 (smallest distance less than maximum allowed) allows the sorting operation to continue and execution advances to block 720, where the pulse data sets constituting the closest pair of pulse data sets identified in block 714 are merged. In an example, the pulse data sets constituting the closest pair of pulse data sets is merged by averaging them. Other ways of merging pulse data sets are known and may be used.

In an example in which two merged pulse data sets are merged by averaging them or a pulse data set is merged with a merged pulse data set by averaging them, the merging operation performs averaging that is weighted in accordance with the number of pulse data sets that have been merged to form each merged pulse data set. In another example in which two merged pulse data sets are merged by averaging them or a pulse data set is merged with a merged pulse data set by averaging them, the averaging operation averages the pulse data sets that are the constituents of each merged pulse data set.

In block 724, the merged pulse data set generated in block 720 is stored in the pulse data set memory.

In block 726, a respective distance is calculated between the merged pulse data set generated in block 720 and each other of the pulse data sets (including, in late iterations, other merged pulse data sets) stored in the pulse data set memory.

In block 728, in the distance memory, the distances stored therein for the pulse data sets that were merged in block 720 are replaced with the distances calculated in block 726 for the merged pulse data set.

Execution then returns to the beginning of the loop at block 714, where a pair of pulse data sets for which the distance stored in the distance memory is smallest is identified as a new closest pair of pulse data sets. The loop composed of blocks 714, 716, 720, 724, 726, and 728 repeats to sort the pulse data sets into classes based on correlation until a NO result is obtained in block 716.

The methods described above with reference to FIGS. 9-14, and block 506 of the method described above with reference to FIG. 8 are typically performed by a computer (as defined above) in response to a sorting program. In response to the sorting program, the computer implements all of the operations described above. This disclosure provides sufficient information for a programmer to write a suitable sorting program using a high-level (e.g., C or C.sup.++) or low-level programming language. Accordingly, the program listing itself is omitted.

As an alternative to the sorting methods described above, a correlation clustering algorithm may be used to sort the pulse data sets into classes based on correlation coefficients. An example of a correlation clustering algorithm written in MATLAB® script is set forth below.

The exemplary algorithm receives pulse data sets and stores them in an (n×m) array called pulses, where n is the number of samples per pulse data set and m is the number of pulse data sets that were recorded. The algorithm returns an array of averaged pulse data sets called classAverages. This array has dimension (n×k) where k is the number of distinct classes into which the pulse data sets were sorted by the algorithm. The algorithm also returns a one-dimensional array of length k called coadds containing the respective number of pulse data sets that were averaged to produce each of the averaged pulse data sets.

```
//normalize samples in array pulses to generate normalized samples normpulses
    normpulses=pulses/max(max(pulses));
    corrcoeffmatrix=corrcoef(normpulses);
    classAverages=[ ];
    coadds=[ ];
//index i labels a distinct class into which the pulse data sets are sorted
    i=1;
// Sort the rows of the correlation coefficient matrix corrcoeffmatrix in decending
// order (indicated by the -1) based on the value of the element in the first column,
// Variable index is a list indicating the order of the sort.
    while ~isempty(corrcoeffmatrix)
        [rowsorted index]=sortrows(corrcoeffmatrix, -1);
        classSum=zeros(size(normpulses,1),1);
        // Step through the 1st column of the sorted correlation coefficient matrix until the
        // correlation coefficient drops below the value of corrthresh to identify the pulse data
        // sets to be assigned to a class i.
        // Sum the pulse data sets assigned to class i.
        k=1;
        while k <= size(corrcoeffmatrix,2) && rowsorted(k,1)>corrthresh
            classSum=classSum+pulses(:,k);
            k=k+1;
        end
        // Divide the summed pulse data sets by the number of pulses data sets in the sum
        // Append resulting average pulse data set to the array classAverages;
        // Append the value of k to the array coadds.
        classAverages=[classAverages classSum/(k-1)];
        coadds=[coadds (k-1)];
        // Remove the entries in the arrays pulses and index that were used to create
        // the i-th average pulse data set.
        pulses(:,index(1:k-1))=[ ];
        index(1:k-1)=[ ];
        // Remove the rows and columns of the array correoeffmatrix corresponding to the
        // pulse data sets used to create the i-th average pulse data set.
        corrcoeffmatrix(:,index(1:k-1))=[ ];
        correoeffmatrix(index(1:k-1),:)=[ ];
        // Increment i and repeat to create the next average pulse data set.
        i=i+1;
    end
```

Correlation clustering algorithms such as that exemplified above are typically executed by a computer (as defined above).

This disclosure describes the invention in detail using illustrative embodiments. However, the invention defined by the appended claims is not limited to the precise embodiments described.

I claim:

1. An optical measurement method, comprising:
    generating a series of light pulses using a pulsed laser having a set of different mode hop sequences;
    detecting the light pulses with a detector optically coupled to the pulsed laser to generate a respective pulse data set for each of the light pulses, the detector includes two sensors to generate electrical pulses from which the pulse data sets are derived, an optical path is between the pulsed laser and the detector, the optical path includes a first branch and a second branch of different optical path lengths, a first beam splitter to divide the light pulses between the branches, and a second beam splitter to direct the light pulses received from both branches onto each of the sensors; and
    sorting, via a processor, the pulse data sets into classes based on correlation by performing a clustering algorithm, in which each of the classes corresponds to a respective one of the mode hop sequences, to perform optical measurements for external-cavity quantum cascade lasers.

2. The method of claim 1, additionally comprising averaging the respective pulse data sets within each of one or more of the classes.

3. The method of claim 1, additionally comprising heterodyning prior to the detecting.

4. The method of claim 1, in which the pulsed laser comprises a quantum cascade laser.

5. The method of claim 1, in which the sorting comprises:
    defining an initial class center for each of a pre-defined number of classes;
    calculating a respective distance from each of the pulse data sets to the class center of each class;
    assigning each pulse data set to the class for which the distance is smallest;
    updating the class center of each class using the average of the pulse data sets assigned to the class; and
    repeating the calculating, the assigning, and the updating until a termination condition is met.

6. The method of claim 1, in which the sorting comprises:
calculating a respective distance between each of the pulse data sets and each other of the pulse data sets;
storing each distance in a distance memory; and
performing a loop, comprising:
- identifying a pair of the pulse data sets for which the distance stored in the distance memory is smallest, the pair of pulse data sets identified constituting a closest pair of pulse data sets,
- merging the closest pair of pulse data sets to form a merged pulse data set,
- calculating a respective distance between the merged pulse data set and each other of the pulse data sets, and
- the distance memory, replacing the distances calculated for the pulse data sets that were merged with the distances calculated for the merged pulse data set.

7. The method of claim 6, in which the loop is performed until, in the identifying, the distance that is smallest is greater than a maximum allowed distance corresponding to a minimum allowed correlation.

8. The method of claim 1, wherein performing the clustering algorithm includes performing K-means distribution.

9. The method of claim 8, wherein, for each of the pulse data sets, performing the K-means distribution includes calculating a distance to a class center for each of the classes, assigning the pulse data set to the one of the classes that is closest to the pulse data set, and recalculating the class center of the one of the classes to which the pulse data set is assigned based upon an average of the pulse data sets assigned to that one of the classes.

10. The method of claim 1, wherein performing the clustering algorithm includes performing a hierarchical clustering process.

11. The method of claim 10, wherein performing the hierarchical clustering process includes calculating distances between each of the pulse data sets, identifying a pair of the pulse data sets for which the distance is smallest and, responsive to determining that the distance is greater than a maximum allowed distance, merging the identified pair of pulse data sets to form a merged pulse data set and calculating other distances between the merged pulse data set and each of the other pulse data sets.

12. An optical instrument, comprising:
a pulsed laser to generate a series of light pulses using a set of different mode hop sequences;
a detector optically coupled to the pulsed laser to generate a respective pulse data set in response to each of the light pulses, the detector includes two sensors to generate electrical pulses from which the pulse data sets are derived;
an optical path between the pulsed laser and the detector, the optical path includes:
- a first branch and a second branch of different optical path lengths;
- a first beam splitter to divide the light pulses between the branches; and
- a second beam splitter to direct the light pulses received from both branches onto each of the sensors; and
a processor to sort the pulse data sets generated by the detector into classes based on correlation by performing a clustering algorithm, in which each of the classes corresponds to a respective one of the mode hop sequences, to perform optical measurements for external-cavity quantum cascade lasers.

13. The optical instrument of claim 12, in which the processor is to sort the pulse data sets using a clustering algorithm.

14. The optical instrument of claim 12, in which the processor is to sort the pulse data sets into a pre-defined number of classes, and comprises:
a class centers memory to store a class center for each of the classes;
a distance engine to calculate a respective distance from each of the pulse data sets to the class center of each class;
a class assigner operating in response to the distances calculated for each pulse data set to assign the pulse data set to the class for which the distance is smallest; and
an averaging engine to generate a new class center for each class by averaging the pulse data sets assigned to the class, and to update the class center for the class stored in the class centers memory with the new class center.

15. The optical instrument of claim 14, in which the distance engine, the class assigner, and the averaging engine operate cyclically until a termination condition is achieved.

16. The optical instrument of claim 12, in which the processor comprises:
a distance engine to calculate a respective distance between each of the pulse data sets and each other of the pulse data sets;
a distance memory to store the distances calculated by the distance engine;
a smallest distance identifier to identify a pair of the pulse data sets for which the distance stored in the distance memory is smallest, the pair of pulse data sets identified constituting a closest pair of pulse data sets;
a merging engine to merge the closest pair of pulse data sets to form a merged pulse data set;
in which the distance engine is additionally to calculate a respective distance between the merged pulse data set and each other of the pulse data sets; and
the distance memory is additionally to store the calculated distances for the merged pulse data set instead of the calculated distances for the pulse data sets that were merged.

17. The optical instrument of claim 12, in which the pulsed laser comprises a quantum cascade laser.

18. The optical instrument of claim 12, wherein:
the optical instrument is a heterodyne spectrometer to measure an optical property of a sample.

19. The optical instrument of claim 12, wherein the processor performs K-means distribution to sort the pulse data sets generated by the detector into the classes.

20. The optical instrument of claim 12, wherein the processor performs a hierarchical clustering process to sort the pulse data sets generated by the detector into the classes.

* * * * *